United States Patent
Branch et al.

(10) Patent No.: US 11,171,604 B1
(45) Date of Patent: Nov. 9, 2021

(54) ACTIVE SHUNT CAPACITANCE CANCELLING OSCILLATOR FOR RESONATORS

(71) Applicant: National Technology & Engineering Solutions of Sandia, LLC, Albuquerque, NM (US)

(72) Inventors: Darren W. Branch, Albuquerque, NM (US); Kurt Wessendorf, Albuquerque, NM (US); Bryan Carson, Tijeras, NM (US); DeAnna Marie Campbell, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/088,228

(22) Filed: Nov. 3, 2020

Related U.S. Application Data

(60) Provisional application No. 62/932,314, filed on Nov. 7, 2019.

(51) Int. Cl.
*H03B 5/36* (2006.01)
*H03B 5/32* (2006.01)

(52) U.S. Cl.
CPC .......... *H03B 5/364* (2013.01); *H03B 5/326* (2013.01); *H03B 5/366* (2013.01); *H03B 2200/0022* (2013.01); *H03B 2200/0038* (2013.01)

(58) Field of Classification Search
CPC . H03B 5/30; H03B 5/32; H03B 5/326; H03B 5/36; H03B 5/364; H03B 5/366; H03B 5/368; H03B 2200/0022; H03B 2200/0038
See application file for complete search history.

(56) References Cited

U.S. PATENT DOCUMENTS

| | | |
|---|---|---|
| 3,836,873 A | 9/1974 | Healey, III et al. |
| 3,878,481 A | 4/1975 | Healey, III |
| 4,570,132 A | 2/1986 | Driscoll |
| 5,416,448 A | 5/1995 | Wessendorf |
| 6,169,459 B1 | 1/2001 | Wessendorf |
| 6,169,461 B1 | 1/2001 | Andoh et al. |
| 6,624,708 B1 | 9/2003 | Wessendorf |
| 7,804,374 B1 * | 9/2010 | Brown ................ H03B 5/36 331/116 R |
| 7,878,063 B1 | 2/2011 | Cular et al. |
| 8,436,509 B1 | 5/2013 | Branch |
| 8,669,688 B1 | 3/2014 | Branch |
| 8,709,791 B2 | 4/2014 | Larson et al. |
| 9,512,421 B1 | 12/2016 | Branch et al. |
| 9,627,602 B1 | 4/2017 | Guzik |

(Continued)

OTHER PUBLICATIONS

Kelly, R. D., "Electronic Circuit Analysis and Design by Driving-Point Impedance Techniques," IEEE Transactions on Education (1970) E-13(3):154-167.

(Continued)

*Primary Examiner* — Levi Gannon
(74) *Attorney, Agent, or Firm* — Helen S. Baca; Medley, Behrens & Lewis, LLC

(57) ABSTRACT

The present invention relates to an active shunt capacitance cancelling oscillator circuit. Such systems can be used in resonator-based methods, while avoiding impedance distortion and phase shift anomalies.

19 Claims, 24 Drawing Sheets

(56) References Cited

U.S. PATENT DOCUMENTS

| | | |
|---|---|---|
| 10,031,135 B2 | 7/2018 | Larson et al. |
| 10,261,078 B2 | 4/2019 | Branch et al. |
| 2006/0055480 A1 | 3/2006 | Darrer et al. |
| 2006/0114072 A1 | 6/2006 | Lee et al. |
| 2010/0308930 A1* | 12/2010 | Ayazi .................... H03B 5/368 331/154 |

OTHER PUBLICATIONS

Martin, S. J. et al., "Sensing Liquid Properties with Thickness-Shear Mode Resonators," Sandia National Laboratories, Albuquerque, New Mexico, Dec. 29, 1993, SAND94-0079J, 36 pages.

Wessendorf, K. O., "Quartz Oscillator Analysis," Sandia National Laboratories, Albuquerque, New Mexico, Jan. 1988, SAND87-0311, 31 pages.

Wessendorf, K. O., "Driving Point Impedance Circuit Analysis Techniques," Sandia National Laboratories, Albuquerque, New Mexico, Aug. 1993, SAND92-2832C, 81 pages.

* cited by examiner

US 11,171,604 B1

ACTIVE SHUNT CAPACITANCE CANCELLING OSCILLATOR FOR RESONATORS

RELATED APPLICATIONS

This application claims priority to U.S. Provisional Patent Application No. 62/932,314, filed on Nov. 7, 2019, entitled "ACTIVE SHUNT CAPACITANCE CANCELLING OSCILLATOR FOR RESONATORS", the entirety of which is incorporated herein by reference for all purposes.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to an active shunt capacitance cancelling oscillator circuit. Such systems can be used in resonator-based methods, while avoiding impedance distortion and phase shift anomalies.

BACKGROUND OF THE INVENTION

Resonator-based systems can be used to detect mechanical and electrical changes in a sensitive manner. Such systems generally rely on extraction of certain parameters, e.g., changes in resonant frequency and/or amplitude, in order to ascertain the extent of such changes. Precise tracking of such parameters can be challenging, especially in light of non-zero electrical contributions that can arise from the system itself (e.g., contributions from resonator shunt capacitance). Thus, there is a need for advanced methods that avoid complicated signal deconvolution schemes to extract experimentally observed parameters.

SUMMARY OF THE INVENTION

The present invention relates, in part, to use of an active shunt capacitance cancelling oscillator circuit in conjunction with an active resonator. The circuit employs an equal "dummy" capacitance provided by an inactive resonator that possesses similar electrical properties as an active resonator. In addition, the circuit can also provide an output signal that is proportional to the amplitude of oscillation, which is also proportional to resonator loss. Such systems including the oscillator circuit, active resonator, and inactive resonator can provide more accurate tracking of resonator parameters, such as resonant frequency, and monitoring of only the acoustic contributions to be measured.

Also described herein are improved circuit designs for limiting amplifiers for use in such active shunt capacitance cancelling oscillator circuit. In particular embodiments, such amplifiers allow for operation at higher frequencies, as well as possible lower operating resonator loss.

In any embodiment herein, the active resonator and/or the inactive resonator includes an electrode region disposed on the top surface of the piezoelectric substrate. In some embodiments, the active resonator and/or the inactive resonator includes one or more reflector regions disposed on the top surface of the piezoelectric substrate. In particular embodiments, the one or more reflector regions of the active resonator are configured to provide an acoustic cavity disposed within the first piezoelectric substrate, where the acoustic cavity is configured to store mechanical energy from the acoustic wave. In other embodiments, the active resonator and/or the inactive resonator further includes a functionalized active area disposed in proximity to the acoustic cavity.

In any embodiment herein, the active resonator and the inactive resonator includes an identical electrode design. In some embodiments, the identical electrode design is positioned along a first crystal axis of the first piezoelectric substrate and a second crystal axis of the second piezoelectric substrate, in which the first and second crystal axes are different.

In any embodiment herein, the first piezoelectric substrate is configured to propagate the shear horizontal surface acoustic wave, and the second piezoelectric substrate is configured to propagate an out-of-band or weakly coupled acoustic mode, as compared to an acoustic mode including the shear horizontal surface acoustic wave.

In any embodiment herein, a functionalized active area is disposed in proximity to the acoustic cavity. In some embodiments, the functionalized active area includes a plurality of cells (e.g., bacteria or bacterial cells). In other embodiments, the plurality of cells includes a plurality of immobilized cells (e.g., a plurality of immobilized bacteria). In yet other embodiments, the functionalized active area includes a plurality of capture agents (e.g., cells, proteins, etc.) configured to bind to or interact with one or more targets (e.g., drugs, analytes, antibiotics, antimicrobials, etc.).

In any embodiment herein, the system further includes a tank circuit connected between ground and the amplifier input, where the tank circuit includes an inductor, a capacitor, and a resistor.

In any embodiment herein, a connection between two circuit components include direct or indirect electrical connections. For instance, any such connection herein (e.g., in parallel) can include one or more capacitors to facilitate an ac connection or one or more current sources for biasing (e.g., dc biasing). Additional details follow.

Definitions

As used herein, the term "about" means +/−10% of any recited value. As used herein, this term modifies any recited value, range of values, or endpoints of one or more ranges.

By "disposed" is meant that a first structure is located in a particular position relative to a second structure. This position includes direct contact between the first and second structures (e.g., direct continuous or noncontinuous contact) or indirect contact between the first and second structures (e.g., by way of third or further structure(s) disposed between the first and second structures).

By "electrical connection," as used herein, refers to any conductive or semi-conductive structure through which an electrical signal may pass. The electrical signal can be any useful change in electrical field, electric potential, current, or voltage. Non-limiting structures include lines, contact pads, busses, pins, connectors, bond lines, bond pads, etc., formed from any useful material (e.g., an ohmic material, a metal, etc.).

By "microfluidic" or "micro" is meant having at least one dimension that is less than 1 mm and, optionally, equal to or larger than about 1 µm. For instance, a microfluidic structure (e.g., any structure described herein) can have a length, width, height, cross-sectional dimension, circumference, radius (e.g., external or internal radius), or diameter that is less than 1 mm.

By "nano" is meant having at least one dimension that is less than 1 μm but equal to or larger than about 1 nm. For instance, a nanostructure (e.g., any structure described herein, such as a nanoparticle) can have a length, width, height, cross-sectional dimension, circumference, radius (e.g., external or internal radius), or diameter that is less than 1 μm but equal to or larger than 1 nm. In other instances, the nanostructure has a dimension that is of from about 1 nm to about 1 μm.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

Typically, an oscillator circuit is employed to track series resonance frequency $F_s$ of a resonator, as a network analyzer requires additional post-processing to locate $F_s$. Yet, use of oscillator circuits can still remain a challenge, as non-zero shunt capacitance of the active resonator can impact accurate reporting of the effects of an environmental change on F. In particular, if shunt capacitance $C_o$ can be removed, then $F_s$ would occur exactly where the phase crosses zero. The present invention relates, in part, to use of an oscillator circuit that employs an inactive resonator for active shunt capacitance cancelling. In particular embodiments, the inactive resonator has the same electrical and acoustic characteristics of an active resonator, but the inactive resonator propagates an acoustic mode (e.g., a Rayleigh mode) that is not acoustically active, thus serving as a reference capacitor.

Figure 1:
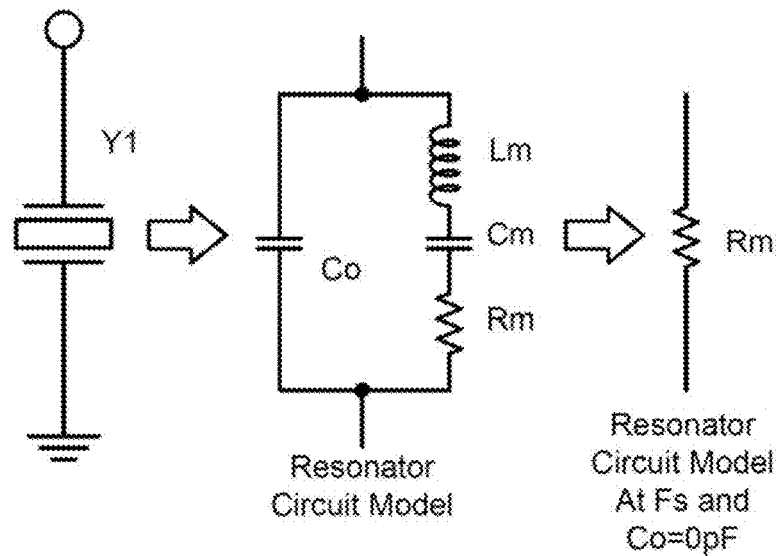
FIG. 1 shows an equivalent circuit of a 1-port acoustic resonator.

FIG. 1 shows a simplified circuit model of a single port resonator $Y_1$, which can be represented by a circuit model that includes a motional arm containing an inductance $L_m$, a capacitance $C_m$, and a resistance $R_m$. This motional arm of the resonator represents the piezoelectric characteristics of the resonator, and shunt capacitance $C_o$ is a parasitic capacitance arising from external to the piezoelectric crystal (e.g., due to the plating of the electrodes on the resonator substrate). The series resonance frequency $F_s$ is defined as the frequency in which $L_m$ and $C_m$ are in resonance, thus providing a measure of resonator loss $R_m$ when $C_o$ is 0 or $C_o$ is a very large reactance, as compared to $R_m$.

Figure 2A:
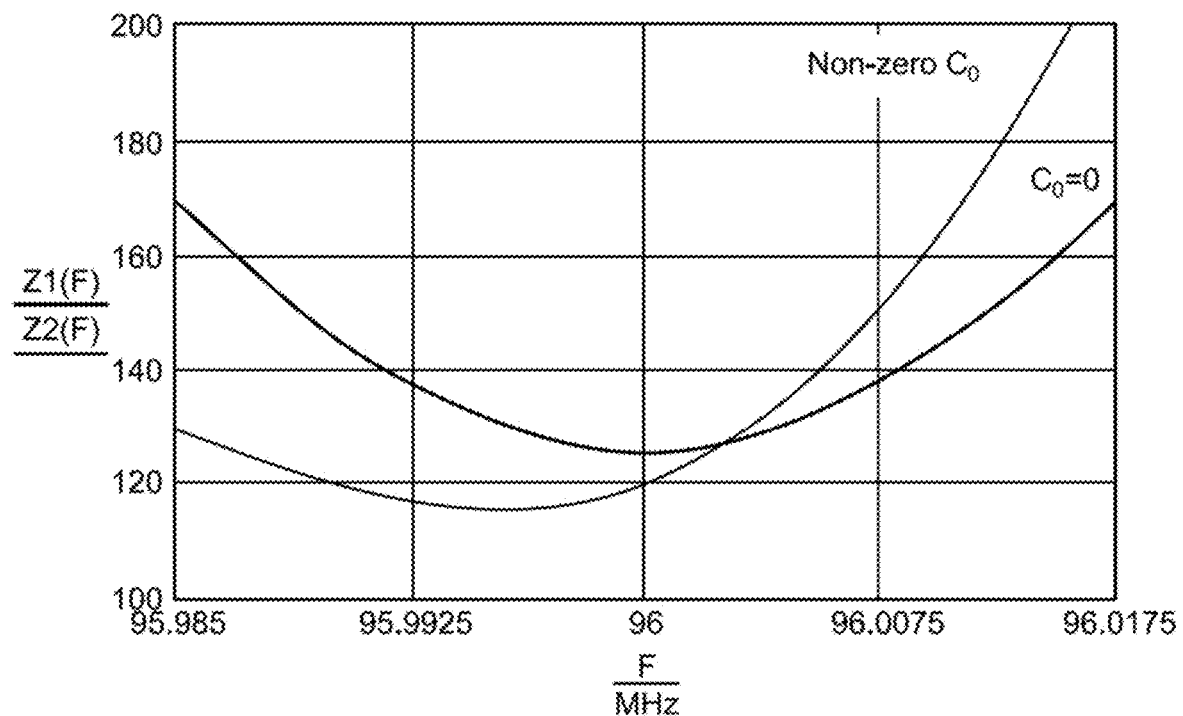
FIGS. 2A-2B show the impact of shunt capacitance ($C_o$) on the resonator. Provided are graphs showing (A) resonator impedance as a function of frequency for non-zero $C_o$ ($C_o$=4 pF) and $C_o$=0 and (B) resonator impedance phase as a function of frequency for non-zero $C_o$ ($C_o$=4 pF) and $C_o$=0.
Figure 2B:
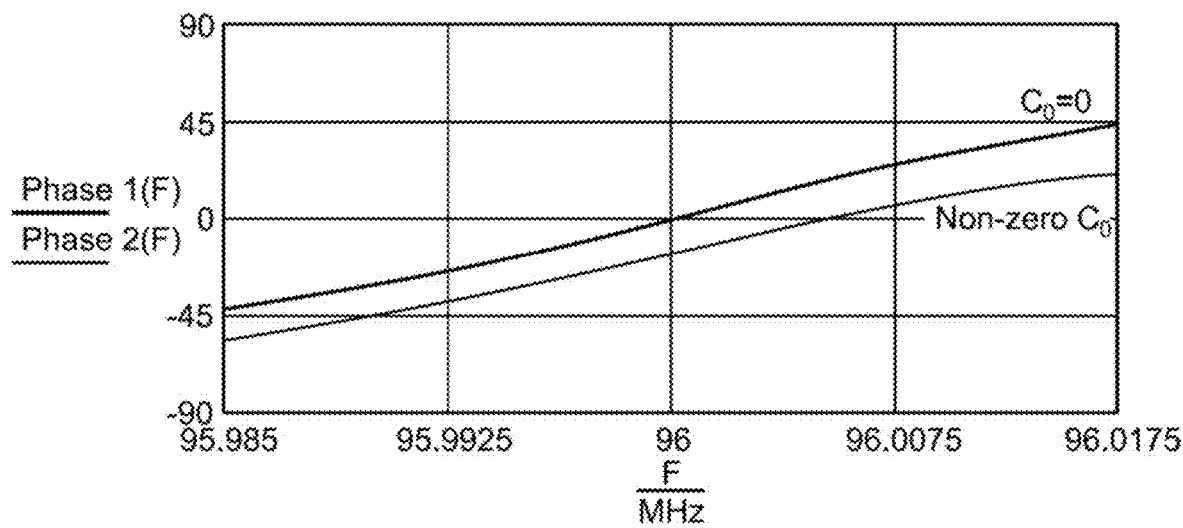

With $C_o$ removed, one can use a series resonant oscillator circuit that monitors the zero impedance phase point of this motional arm, which occurs at $F_s$ of the resonator (FIGS. 2A-2B). Also, one can extract the value of $R_m$ from a series resonant oscillator that removes shunt capacitance, as the resonator impedance is simply $R_m$ at $F_s$ without requiring signal deconvolution. Thus, by minimizing $C_o$, determining relevant parameters (e.g., $F_s$ and/or $R_m$) become simplified.

Yet, $C_o$ is typically a non-zero value due to external contributions, in which interactions between the piezoelectric substrate with electrode plating or fixtures can affect acoustic contributions to $F_s$ and/or $R_m$. Herein, shunt capacitance across the resonator is removed by supplying the circuit an equal "dummy" capacitance, which is used to generate a cancelling current used in the oscillator to electronically cancel the non-desired resonator shunt capacitance. This circuit also supplies an output signal (e.g., a dc voltage) that is proportional to the amplitude of oscillation, which is also proportional to $R_m$.

Figure 3A:
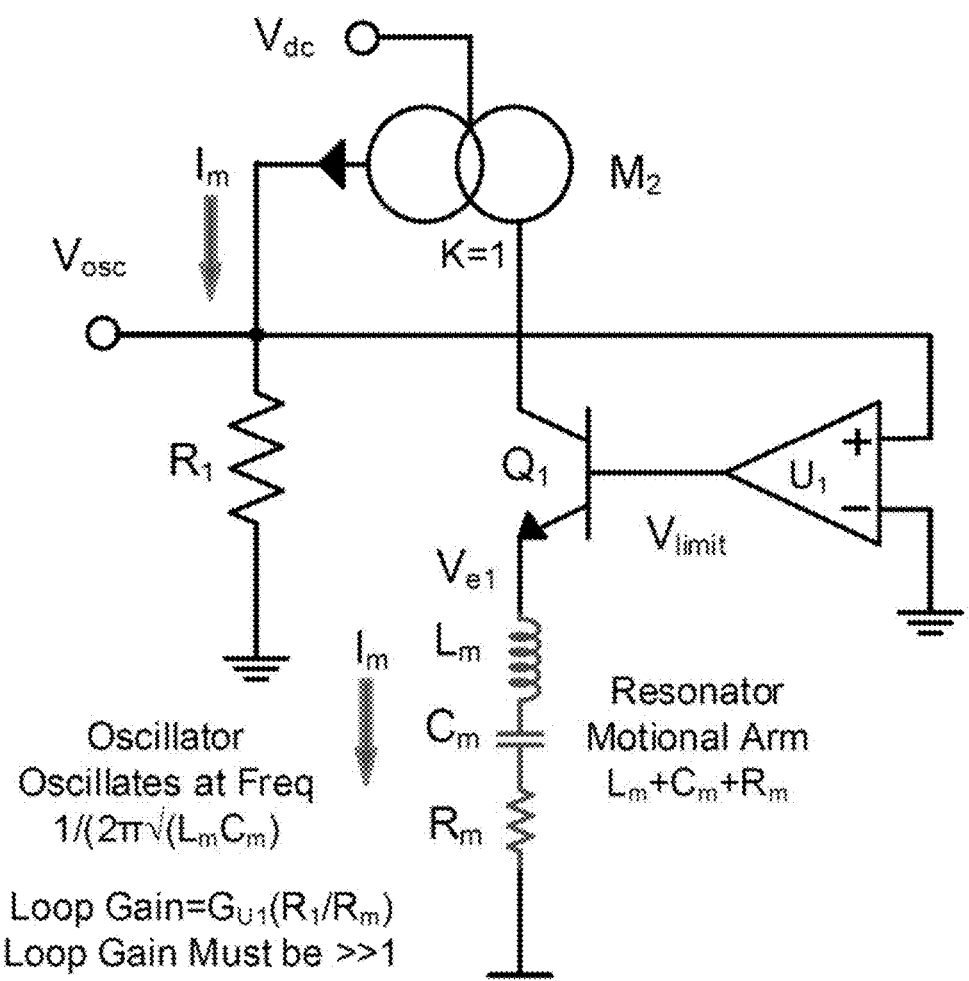
FIGS. 3A-3B show exemplary oscillator circuits with active shunt $C_o$ removal. Provided are (A) an exemplary circuit including a single current mirror $M_2$ and (B) another exemplary circuit including two current mirrors $M_1$, $M_2$.

FIG. 3A provides an exemplary simplified oscillator circuit for a single port resonator. The active resonator is represented by a motional arm containing $L_m$, $C_m$, and $R_m$. Ideally, current $I_m$ is passed from the current mirror $M_2$ to the motional arm in a manner that shunt capacitance is cancelled, leaving only the motional arm current. Herein, current $I_m$ is controlled by a capacitance of the inactive resonator, thereby effectively cancelling out a shunt capacitance associated with the active resonator.

Figure 3B:
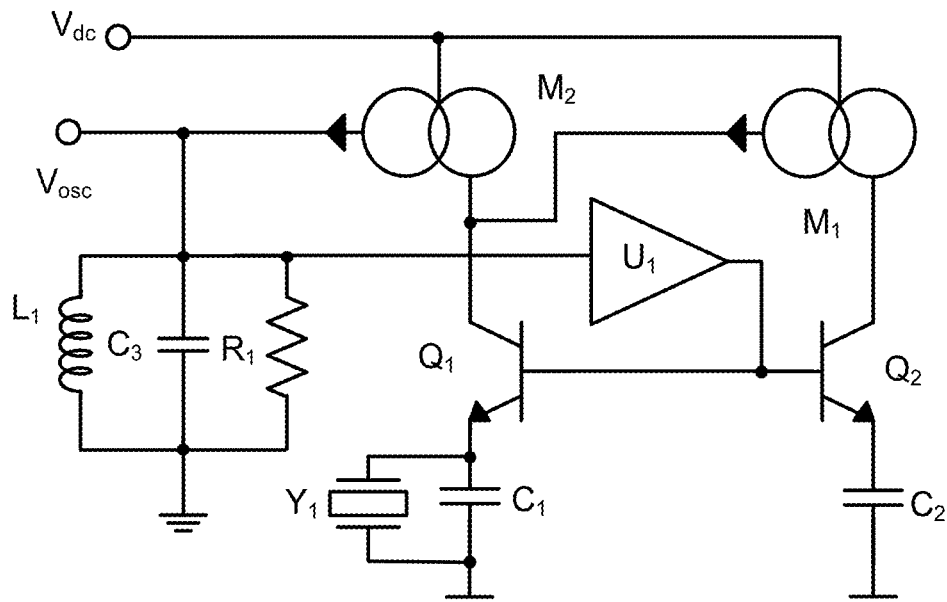

By minimizing acoustic propagation within the inactive sensor, a matched capacitor is formed. Such a capacitor can be employed as a reference capacitor within an oscillator circuit to remove non-zero shunt capacitance of the active sensor. FIG. 3B provides a functional diagram of an exemplary oscillator circuit including an active resonator $Y_1$; an amplifier $U_1$ including an amplifier input and an amplifier output; a first transistor $Q_1$ connected between the active resonator and the amplifier output; and a current mirror $M_2$ connected between the first transistor and the amplifier input, wherein the current mirror is configured to provide a current component $I_m$ controlled by a capacitance of an inactive resonator, thereby effectively cancelling out a shunt capacitance associated with the active resonator. Contribution of the inactive resonator can be provided to the current mirror $M_2$ in any useful manner. In one non-limiting embodiment, another current mirror $M_1$ passes a copy of the capacitance from the inactive resonator to current mirror $M_2$.

As seen in FIG. 3B, a dummy capacitor $C_2$ (e.g., an inactive resonator) is employed to electronically remove the total shunt capacitance of the resonator $Y_1$ at emitter $Q_1$. Such a design could allow for accurate fs and resonator loss determination and can be implemented in any useful manner (e.g., as any electronics module described herein, such as a PCB with electrical connections). As can be seen, the circuit includes an active resonator $Y_1$ with shunt capacitance $C_1$, an inactive resonator $C_2$, an amplifier $U_1$, a first transistor $Q_1$ (having an input connected to the amplifier output and a non-inverting output connected to the active resonator), a first current mirror $M_2$ (connected between an inverting output of the first transistor and the amplifier input), a second transistor $Q_2$ (having an input connected to the amplifier output and a non-inverting output connected to the inactive resonator), and a second current mirror $M_1$ (connected between an inverting output of the second transistor and the inverting output of the first transistor). In this configuration, current mirrors $M_1$, $M_2$ provide a current component controlled by a capacitance of the inactive resonator $C_2$, thereby effectively cancelling out a shunt capacitance $C_1$ associated with the active resonator $Y_1$. Optionally, the circuit can include a tank circuit having an inductance Li, a capacitance $C_3$, and a resistance $R_1$.

In use (FIG. 4A), the oscillator circuit employs the emitters of $Q_1$ and $Q_2$ as active ports to convert impedances of the active resonator $Y_1$ with shunt capacitance $C_1$ and a dummy capacitance $C_2$ into currents that will be summed at an output node. In this way, the equivalent circuit functions as an oscillator, where the frequency of oscillation only depends on the motional arm of the resonator circuit. To cancel the effects of the shunt capacitance across the resonator $C_o+C_1$, the value of $C_2$ needs to equal $C_o+C_1$. In addition, current mirror $M_1$ passes on a copy of the dummy capacitance current $I_{C2}$ to mirror $M_2$, where the summing of the two current legs across $Q_1$ and $Q_2$ cancels the shunt capacitance currents and leaves only the motional arm current $I_m$ to provide an output voltage $V_{osc}$ at node $R_1$.

The gain of amplifier $U_1$ is real, in which loop gain $A_v$ is $R_1(G_{U1})/(X_{Lm}+X_{Cm}+R_m)$, where $X_{Lm}$ and $X_{Cm}$ are the reactance of $L_m$ and $C_m$, respectively. The oscillator will oscillate when $A_v$ is greater than one, and the oscillation frequency is determined by where this loop function is real (or 360 degrees), which only occurs when $X_{Cm}+X_{Lm}=0$ or when $F_{osc}=1/(2\pi\sqrt{L_m C_m})$. The loop gain equation at this frequency is $R_1(G_{U1})/R_m$. The voltage at node $V_{osc}$ is then simply the limiting voltage of $U_1$ multiplied by the ratio of $R_1/R_m$.

In some embodiments, at the node $V_{osc}$, $R_1$ can employ a parallel tank circuit to provide a wider range of operational frequencies and/or selection of a resonator overtone, if desired. FIG. 4B provides a simplified active shunt cancelling oscillator with a tank circuit. The output tank, at $V_{osc}$, is a relatively low Q parallel tank circuit, where Li is chosen to be resonant with $C_3$ at the desired resonator frequency.

Figure 5:
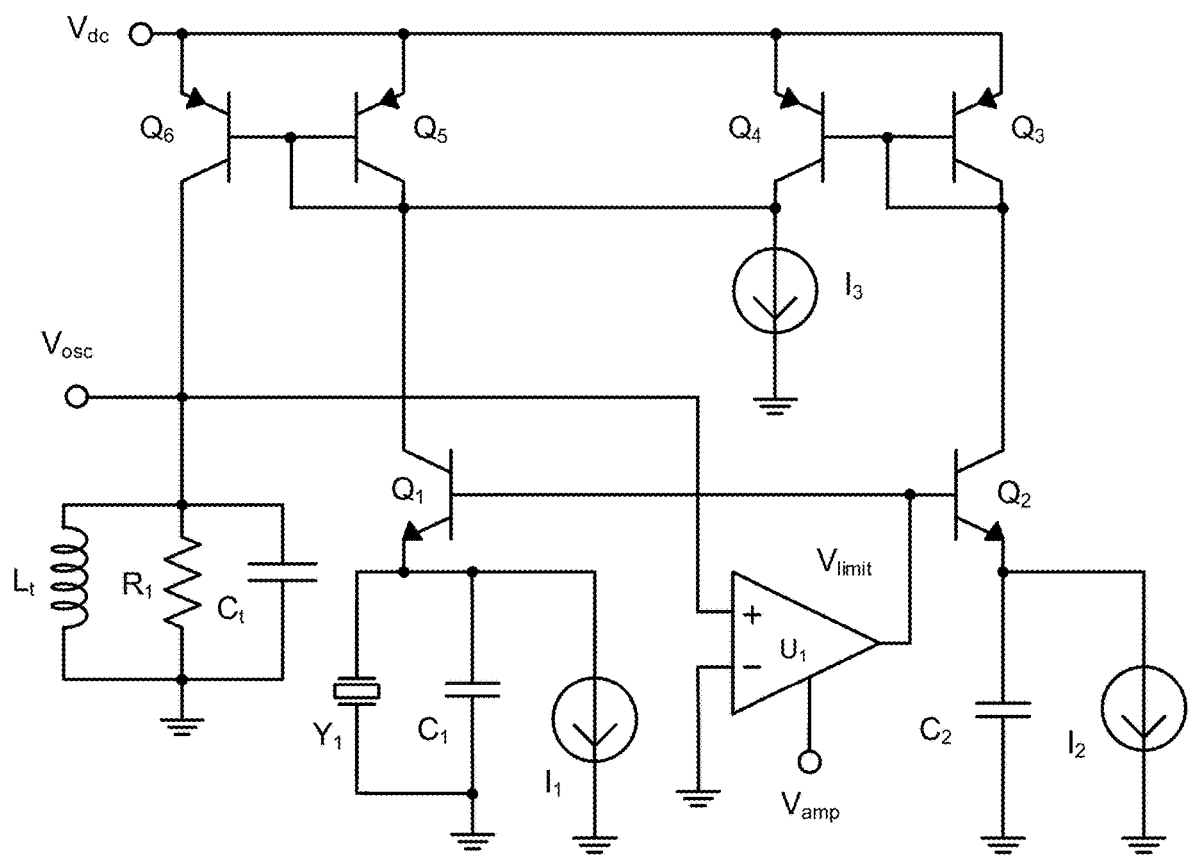
FIG. 5 shows yet another exemplary oscillator circuit with active shunt $C_o$ removal.

FIG. 5 shows an implementation of an oscillator circuit. As can be seen, the circuit includes an active resonator $Y_1$ with shunt capacitance $C_1$, a first current source $I_1$ connected in parallel to the active resonator, an inactive resonator $C_2$, a second current source $I_2$ connected in parallel to the inactive resonator, an amplifier $U_1$, a first transistor $Q_1$ (having an input connected to the amplifier output and a non-inverting output connected to the active resonator), a first current mirror (formed from a fifth transistor $Q_5$ and a sixth transistor $Q_6$, which is connected between an inverting output of the first transistor and the amplifier input), a second transistor $Q_2$ (having an input connected to the amplifier output and a non-inverting output connected to the inactive resonator), a second current mirror (formed from a third transistor $Q_3$ and a fourth transistor $Q_4$, which is connected between an inverting output of the second transistor and the inverting output of the first transistor), and a third current source $I_3$ connected between first and second current mirrors. Optionally, the circuit can include a tank circuit having an inductance Lt, a capacitance Ct, and a resistance $R_1$ at a node.

Figure 6:
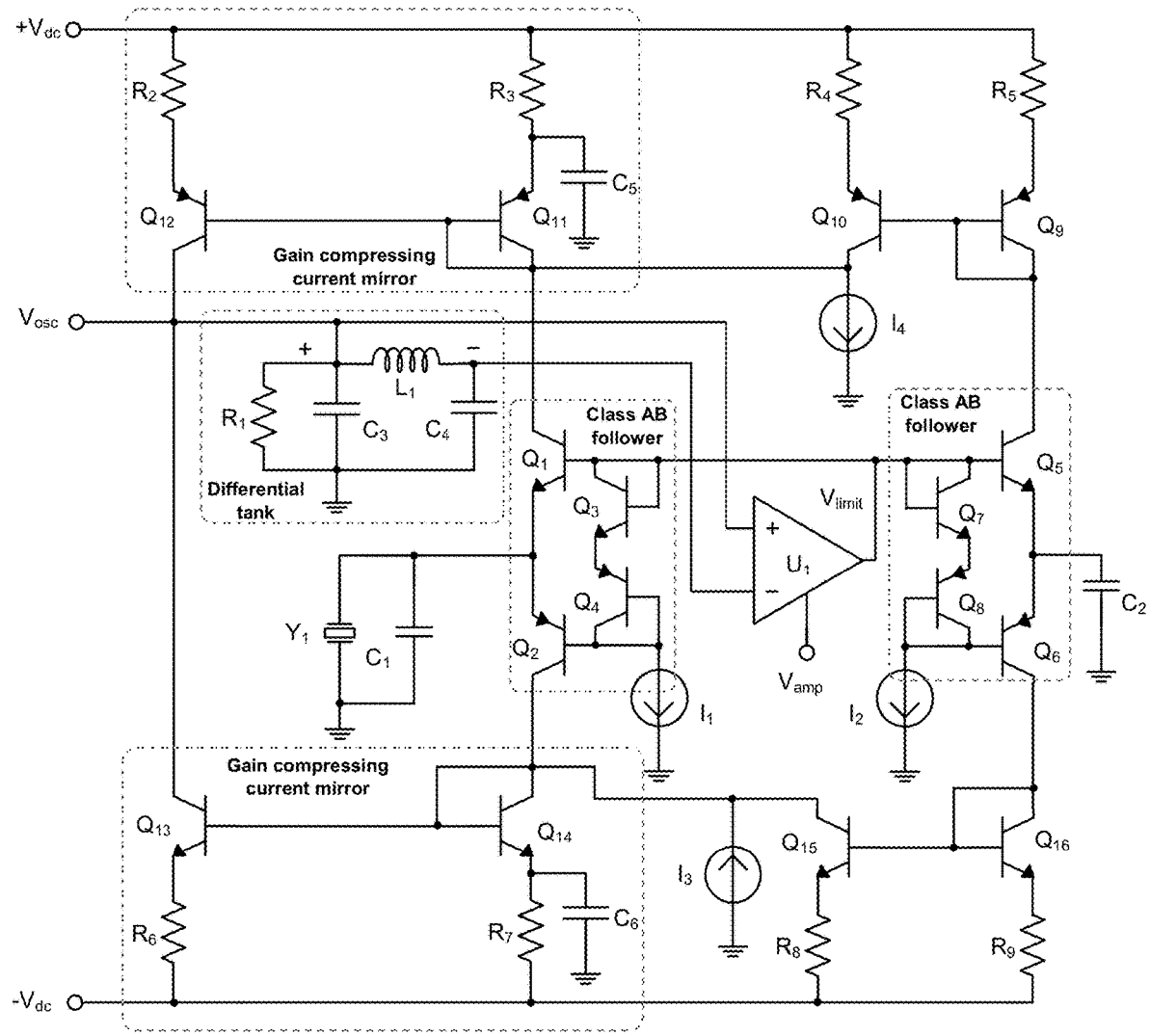
FIG. 6 shows an exemplary oscillator circuit with active shunt $C_o$ removal, in which class AB follower circuits are employed to improve linearity for low loss resonators.

FIG. 6 shows an additional exemplary oscillator circuit in which class AB followers circuits are employed to improve linearity for low loss resonators. Furthermore, gain compressing current mirrors allow low resonator loss, and a differential tank circuit allows for additional gain for high loss resonators.

One or more components can be included in the oscillator circuit. For instance, an amplifier (e.g., a limiting amplifier) can be employed in a feedback loop about a first transistor, with a non-inverting output of the first transistor being connected to drive the resonator at the frequency of oscillation. The limiting amplifier can be, e.g., a differential amplifier with one input connected to an inverting output of a transistor and with another input being electrically grounded at the frequency of oscillation. The output of the limiting amplifier can be connected to the input of the transistor to provide positive feedback for oscillation. The limiting amplifier can optionally provide a frequency output signal that is representative of the frequency of oscillation of the resonator, and a dc voltage output signal that is representative of a resonator loss component $R_m$. In another embodiment, the limiting amplifier comprises a differential amplifier with a first amplifier input being capacitively coupled to the inverting output of the transistor and with a second amplifier input being capacitively coupled to an electrical ground.

Figure 7A:
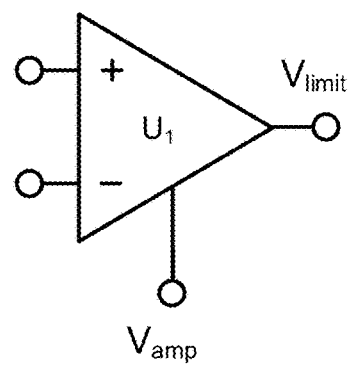
FIGS. 7A-7C show exemplary circuits for limiting amplifiers. Provided are (A) a simplified schematic for a limiting amplifier; (B) an exemplary circuit for a two-stage gain limiting amplifier; and (C) an exemplary circuit for a single stage limiting amplifier.
Figure 7B:
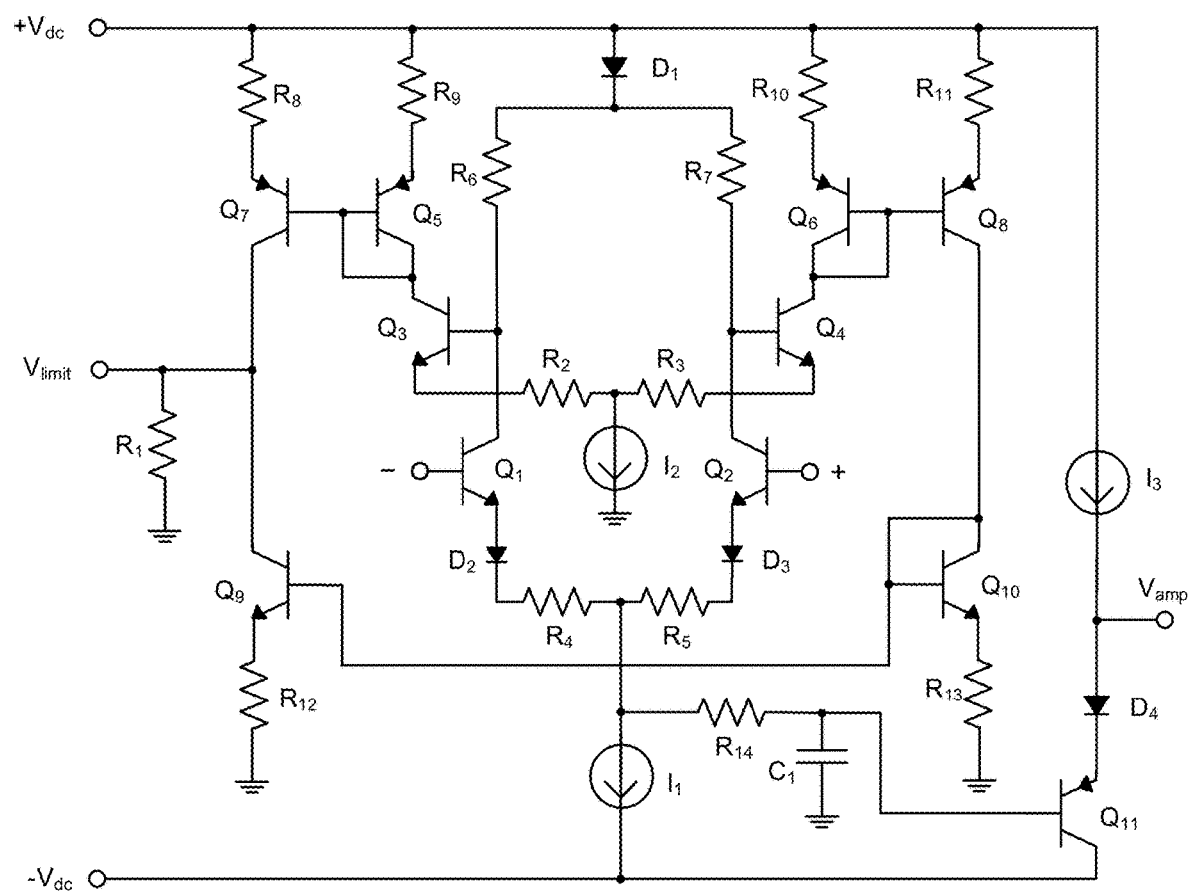
Figure 7C:
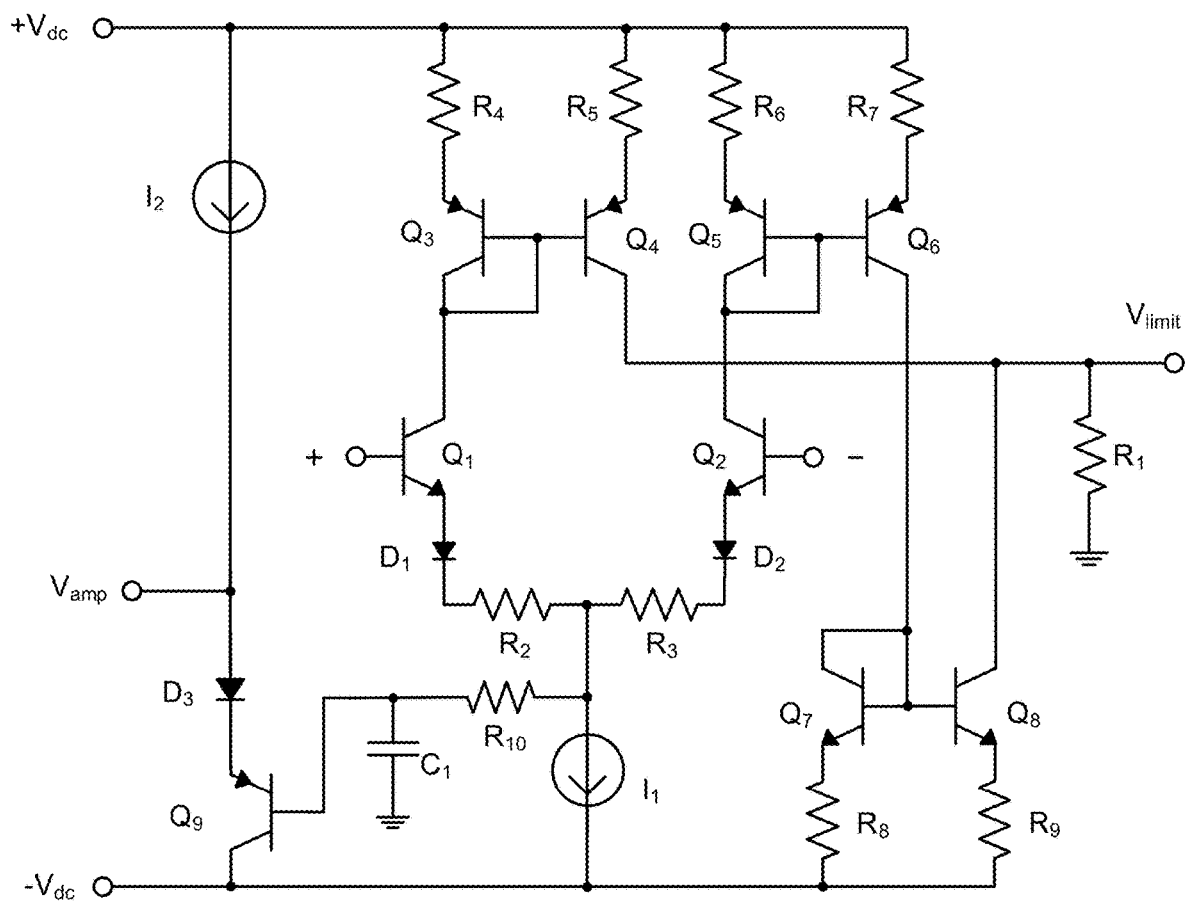
Figure 8:
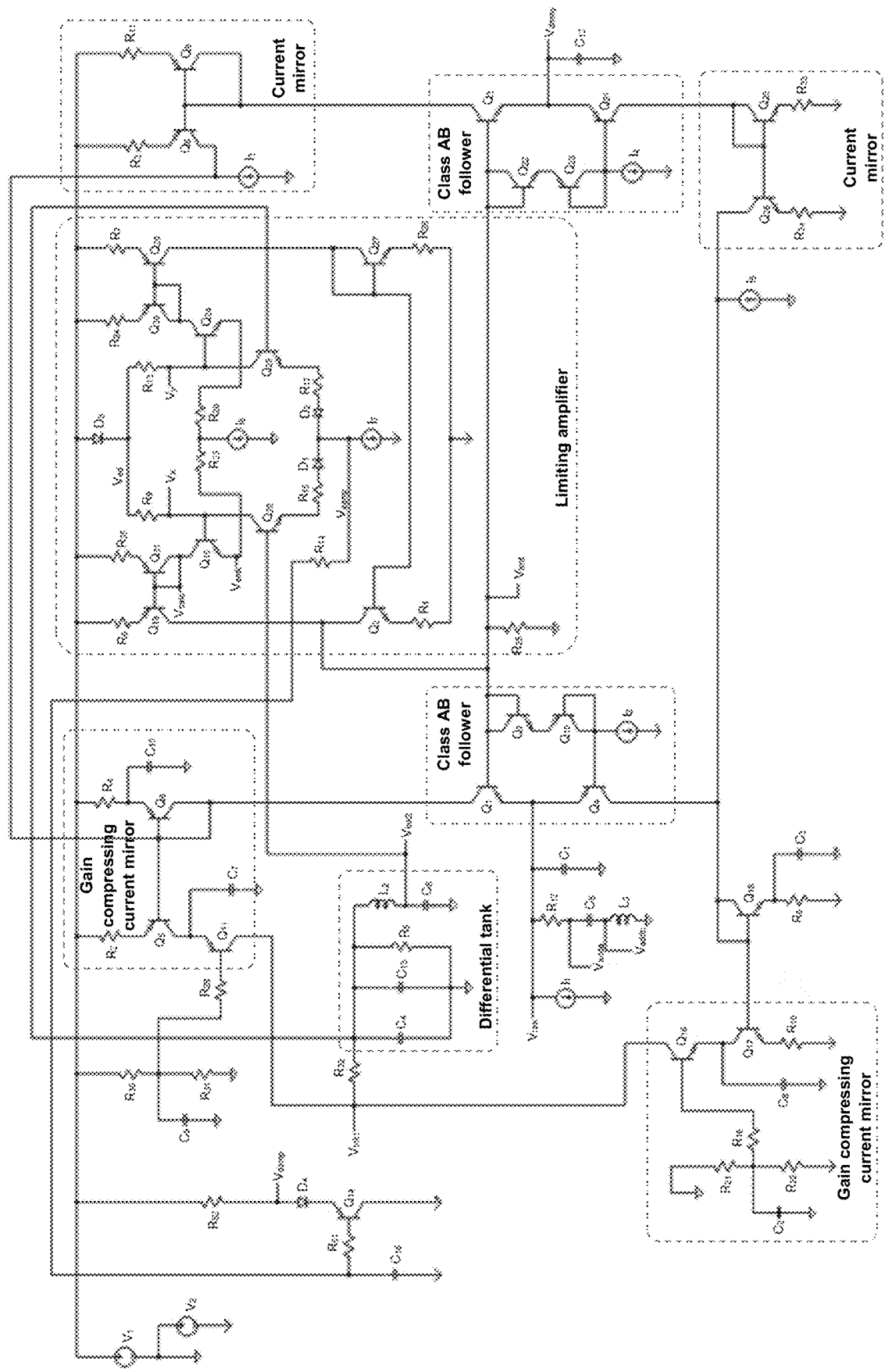
FIG. 8 shows yet another exemplary oscillator circuit with active shunt $C_o$ removal, in which class AB follower circuits and a two-stage gain limiting amplifier are employed.
Figure 9A:
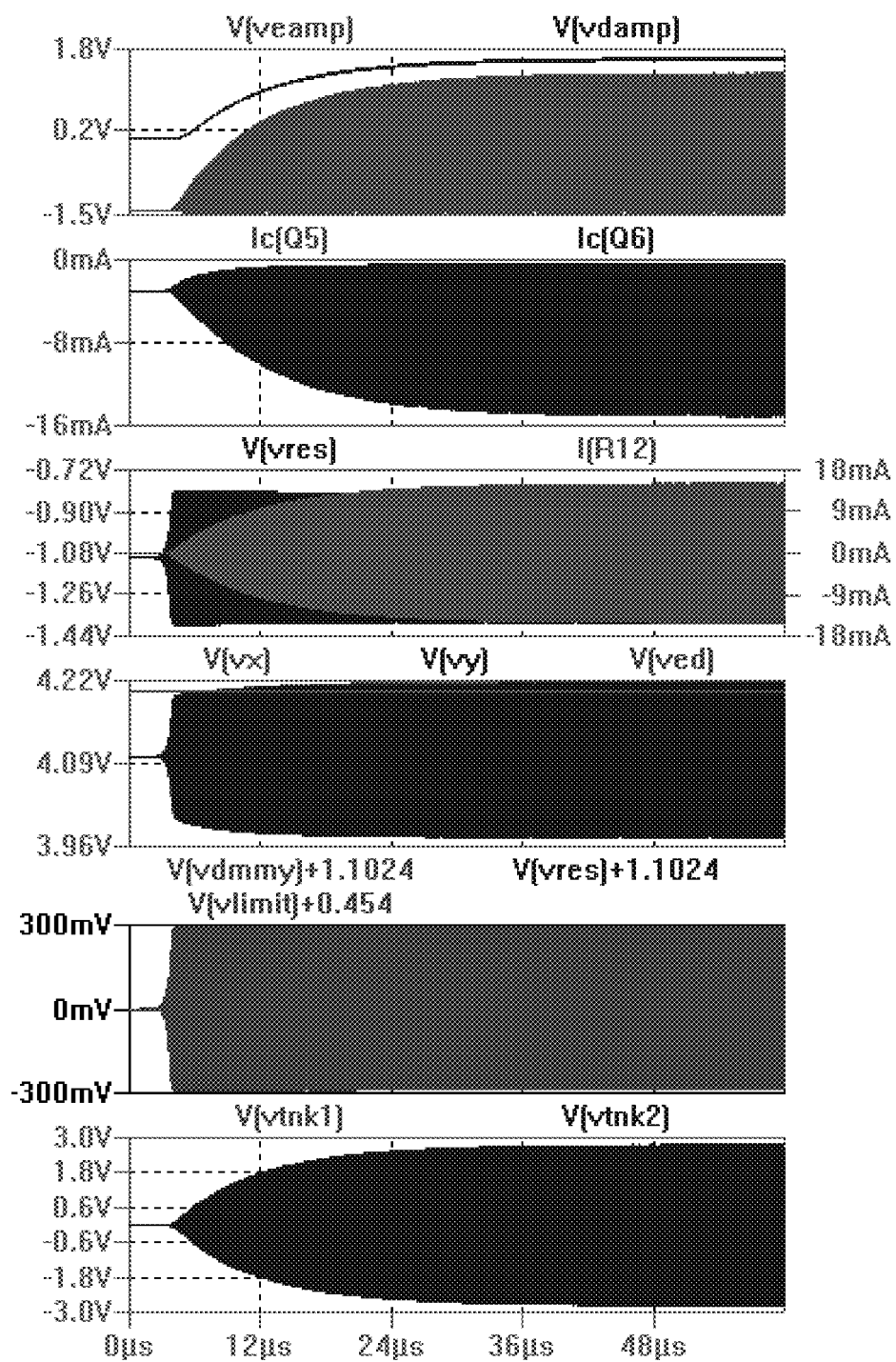
FIGS. 9A-9F show the results of low frequency model simulations. Provided are simulations for resonator losses of (A, B) 20Ω, (C) 200Ω, (D) 1,000Ω, (E) 1,500Ω, and (F) 2,000Ω.
Figure 9B:
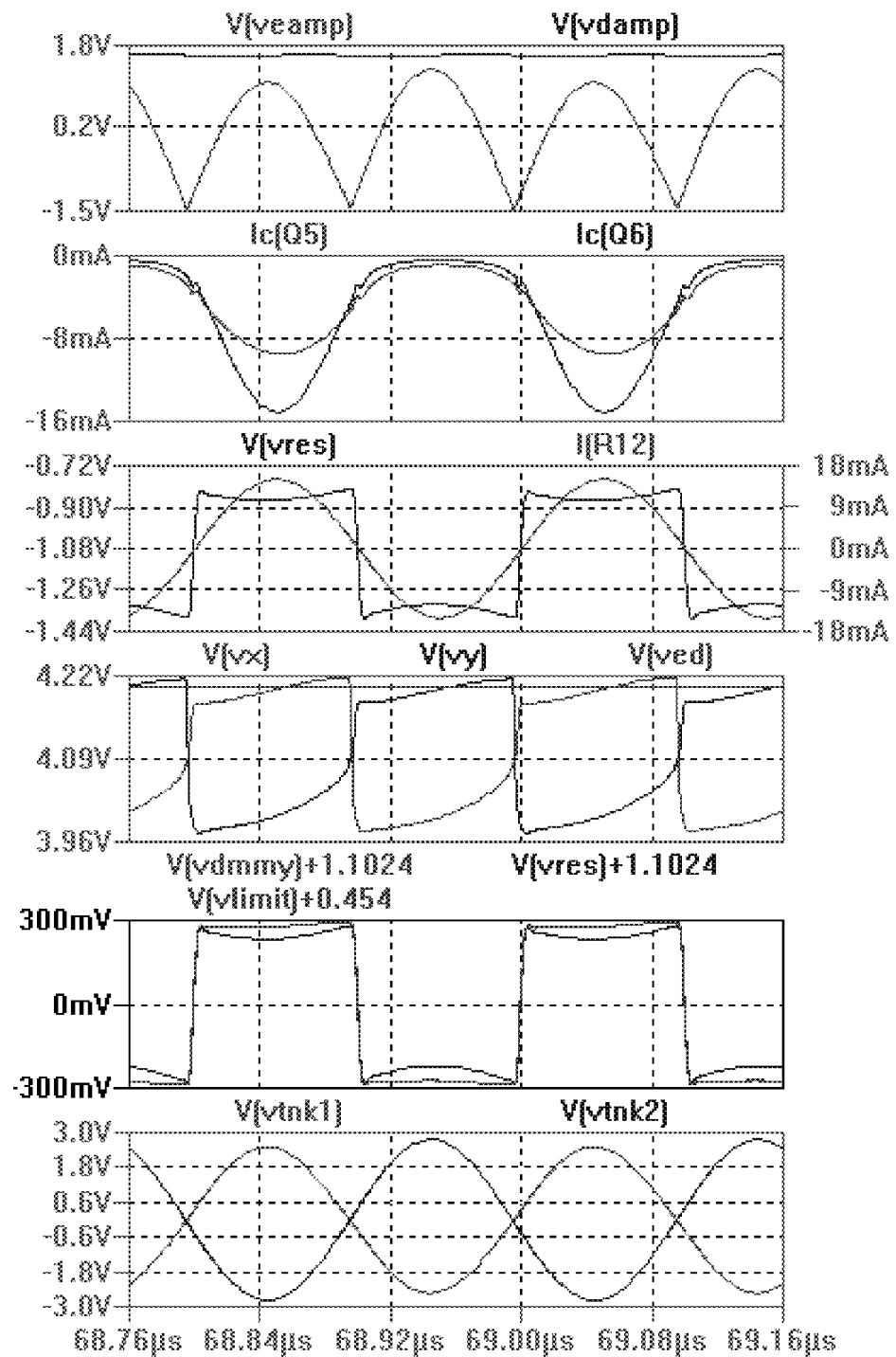
Figure 9C:
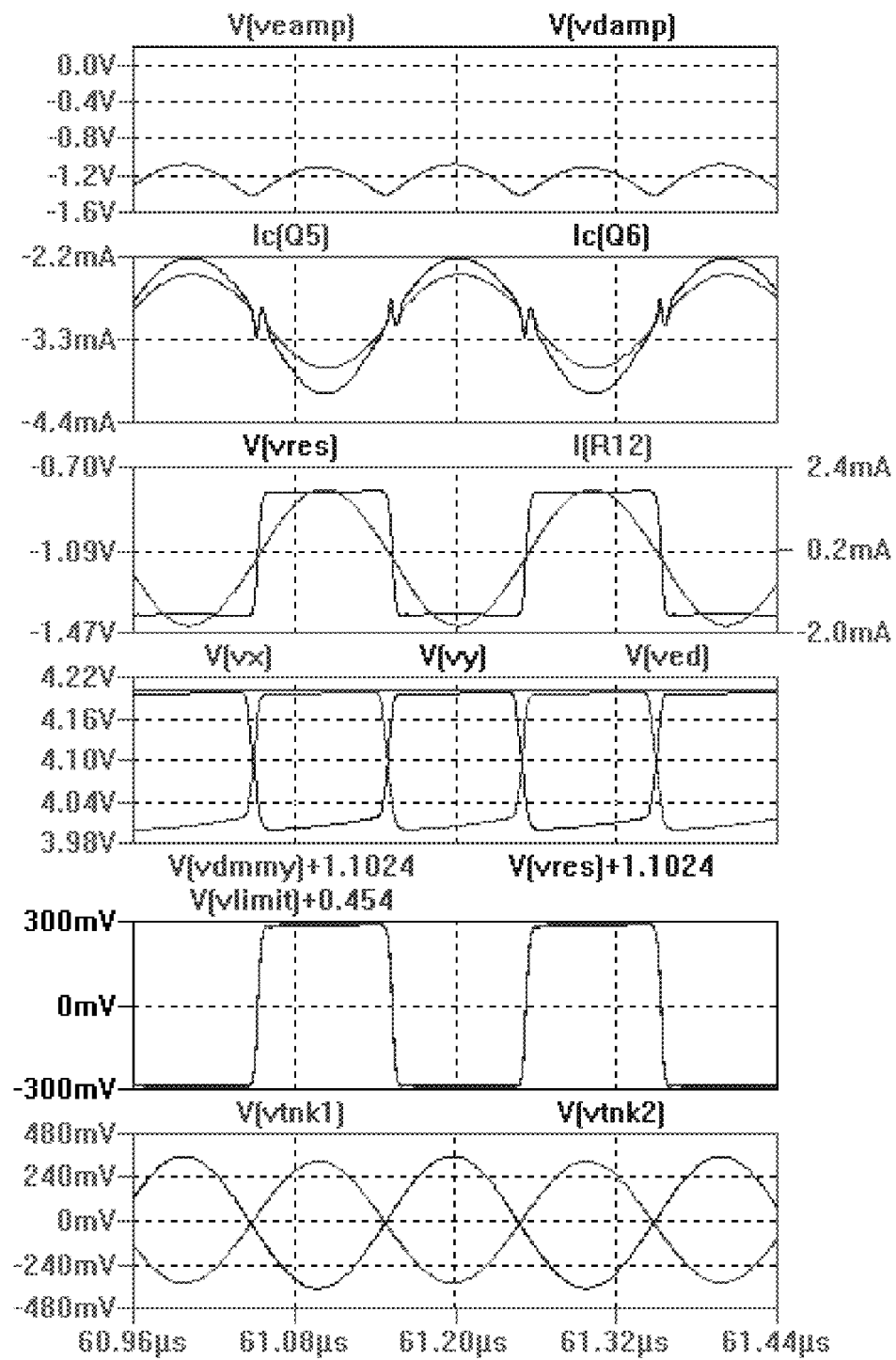
Figure 9D:
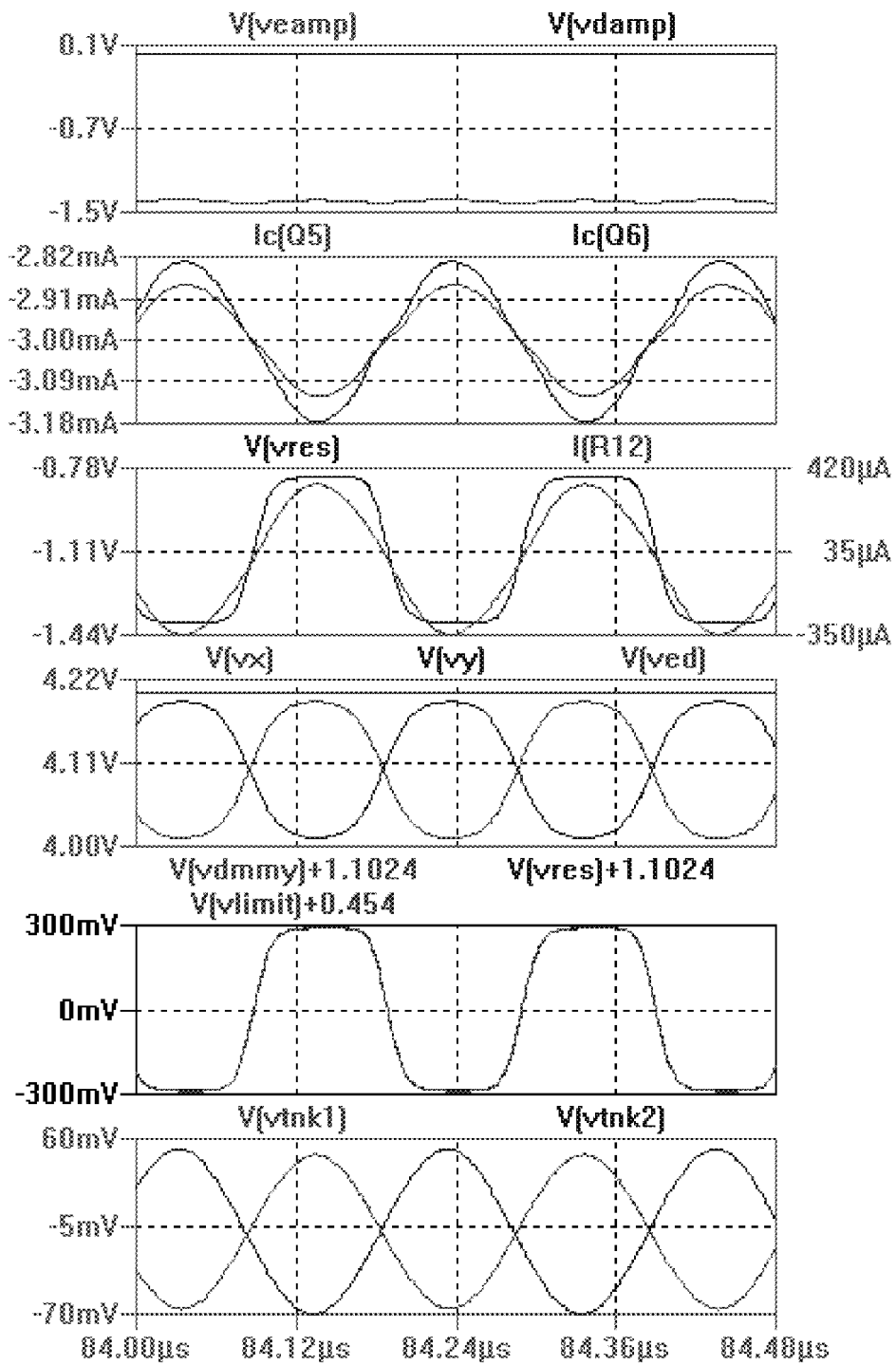
Figure 9E:
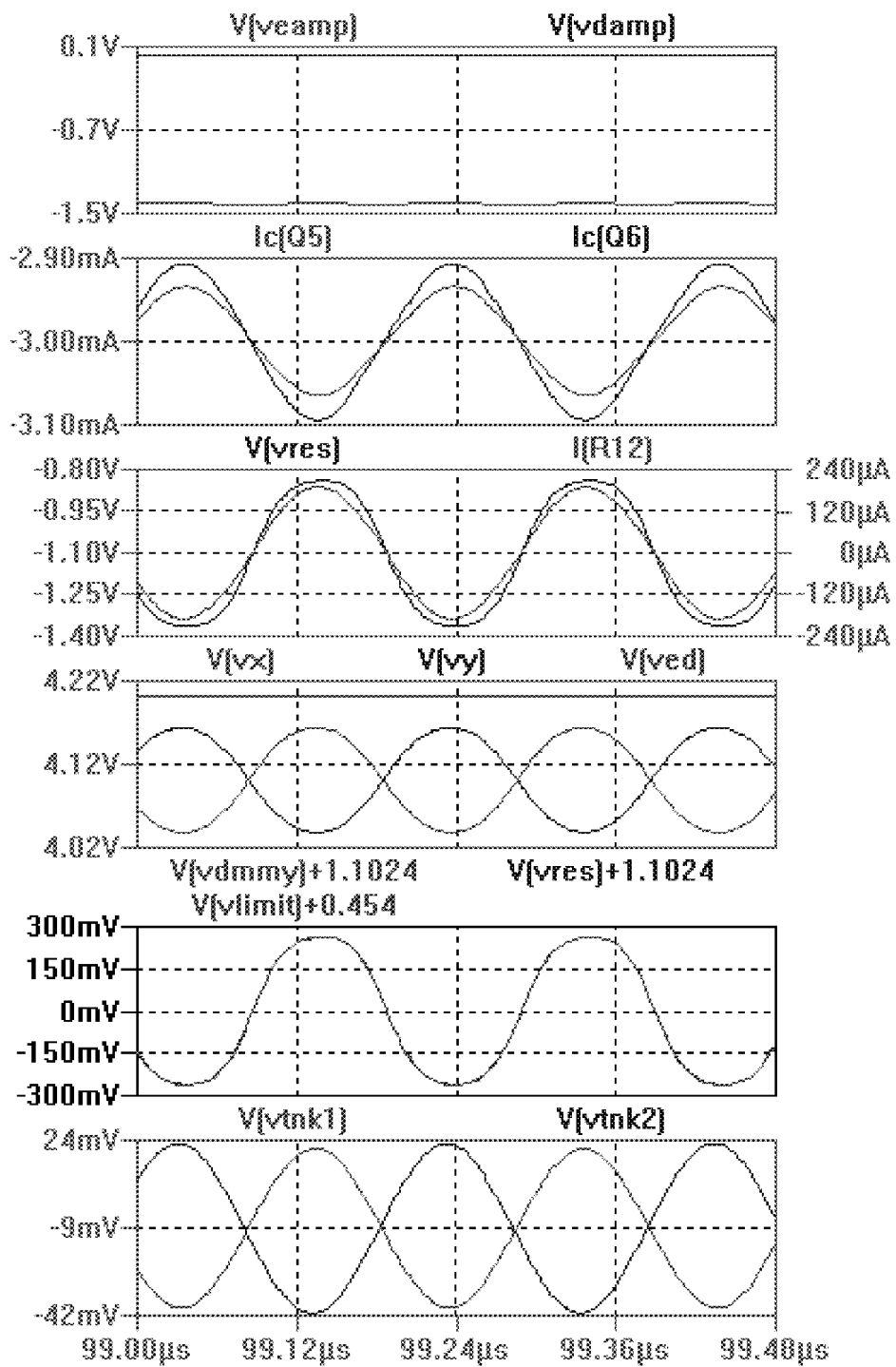
Figure 9F:
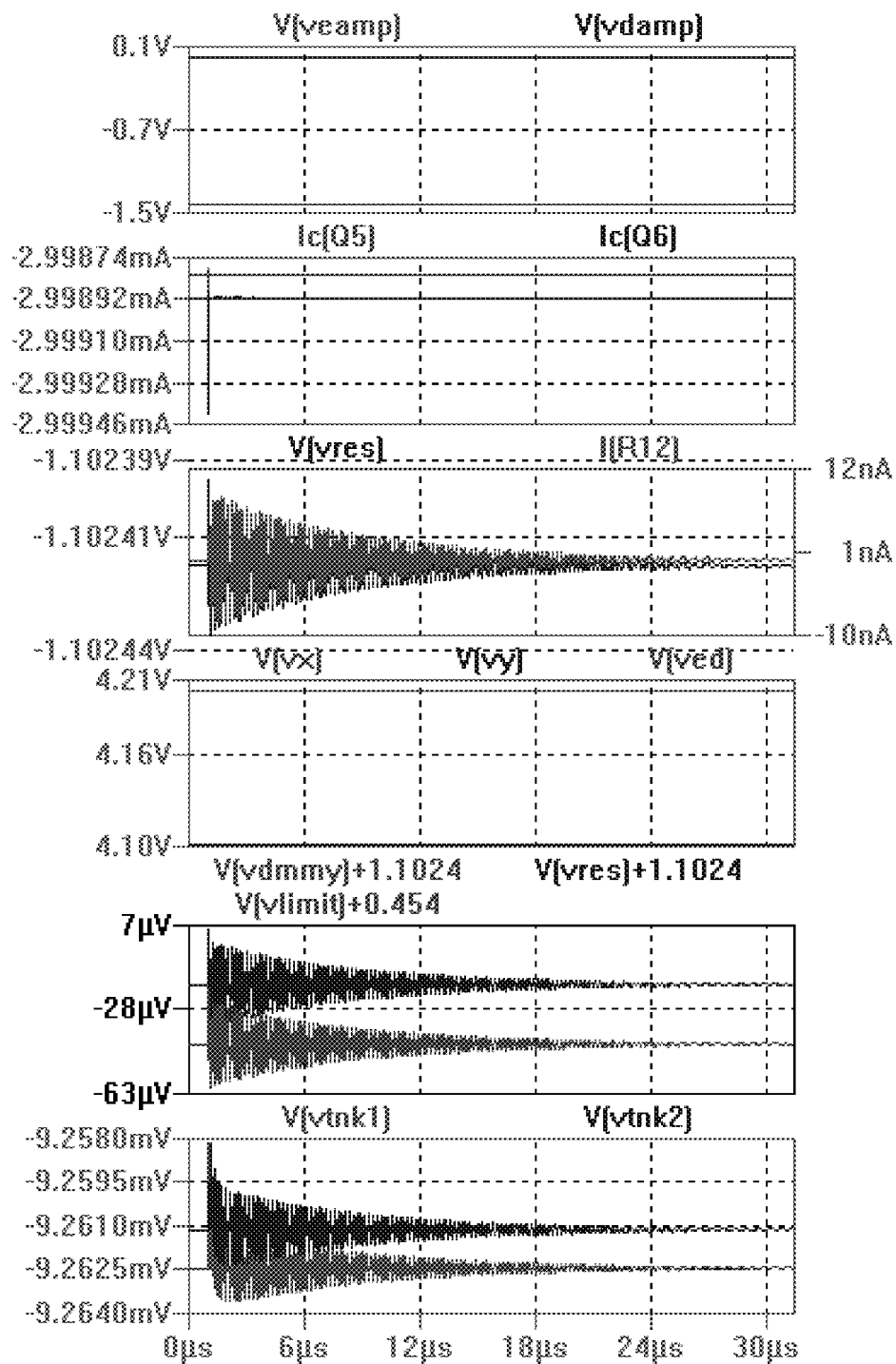
Figure 10:
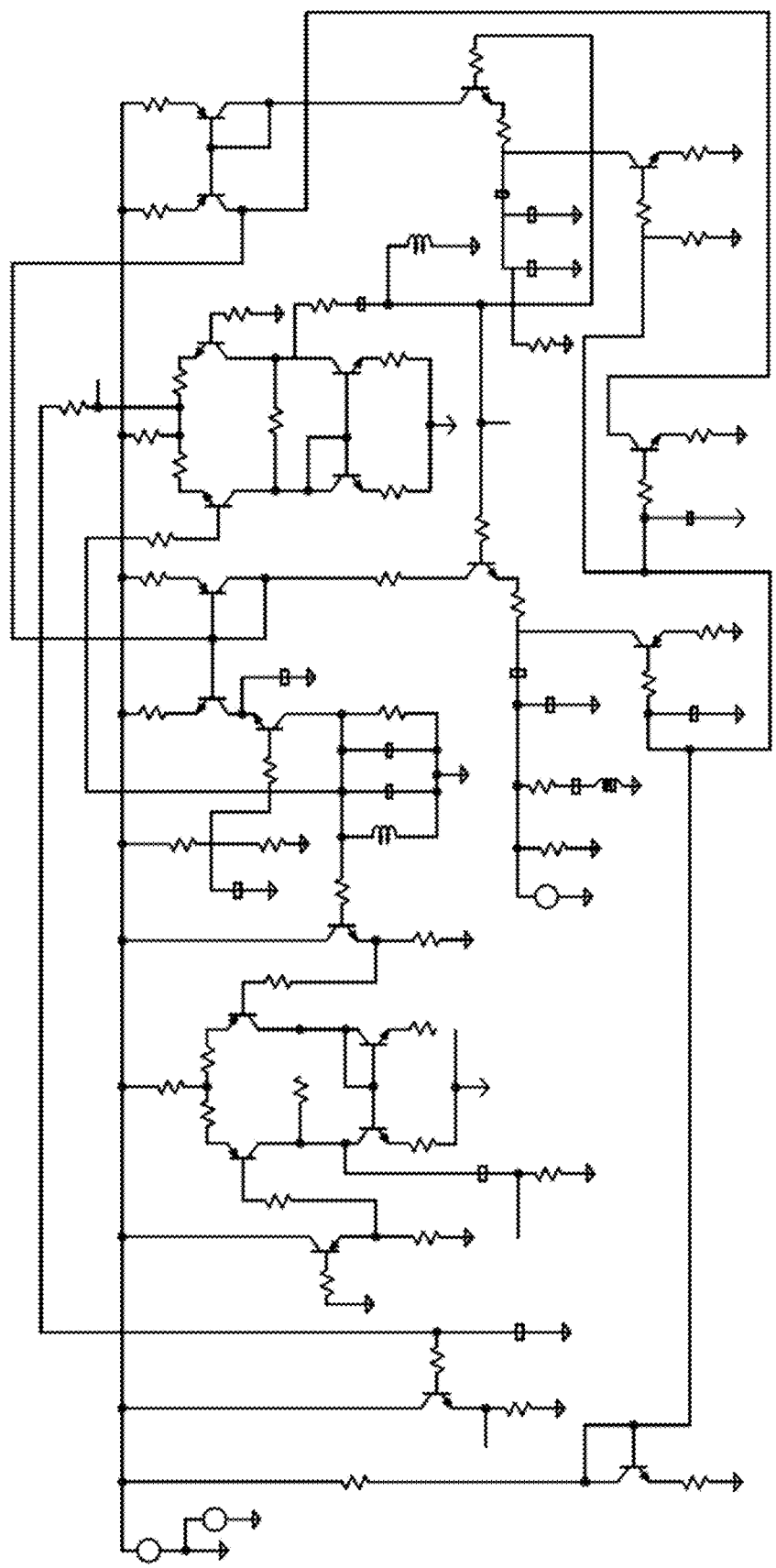
FIG. 10 shows yet another exemplary oscillator circuit with active shunt $C_o$ removal, which was employed for development of a biosensor.
Figure 11:
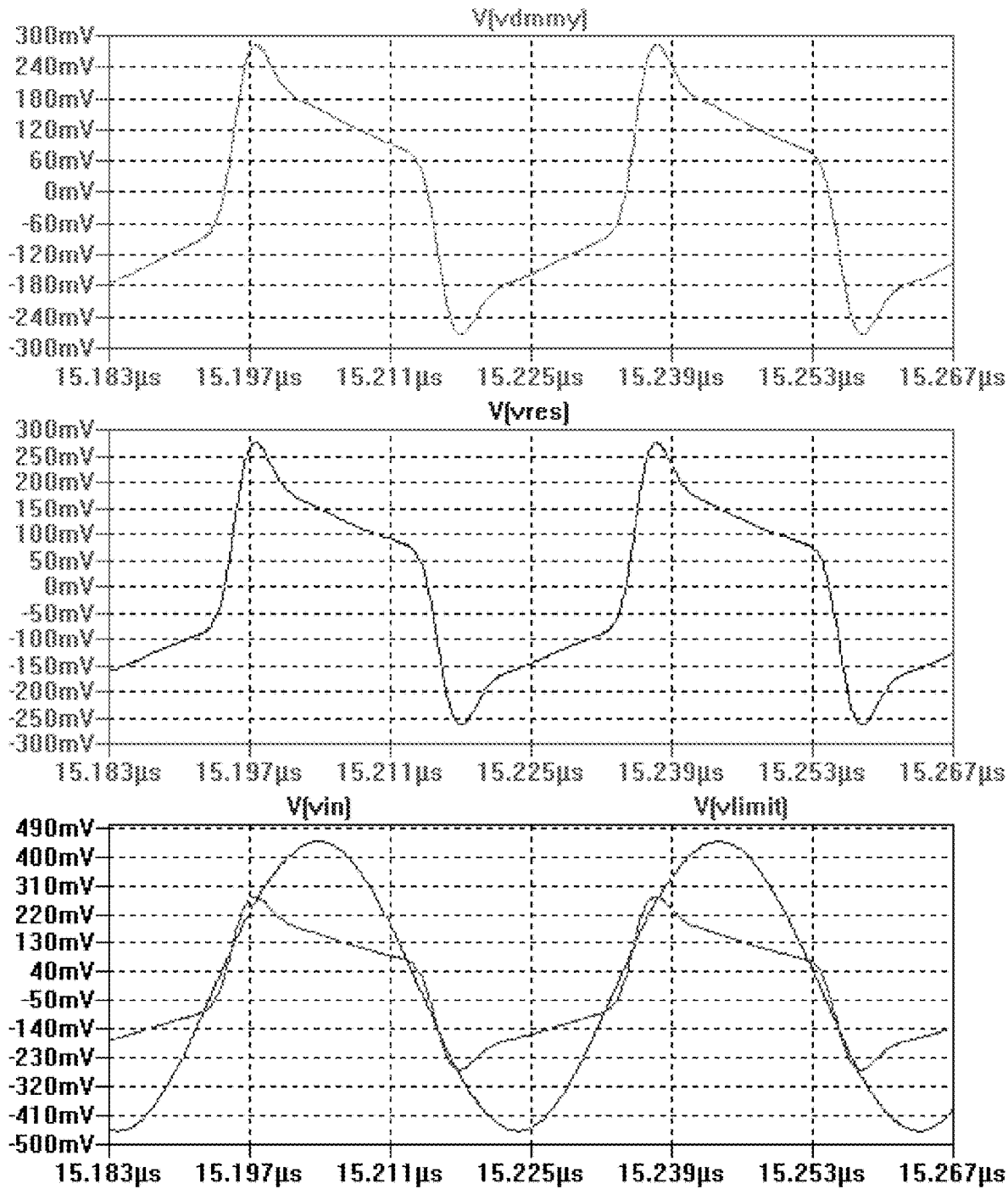
FIG. 11 shows the results of model simulations for the circuit shown in FIG. 10.
Figure 12A:
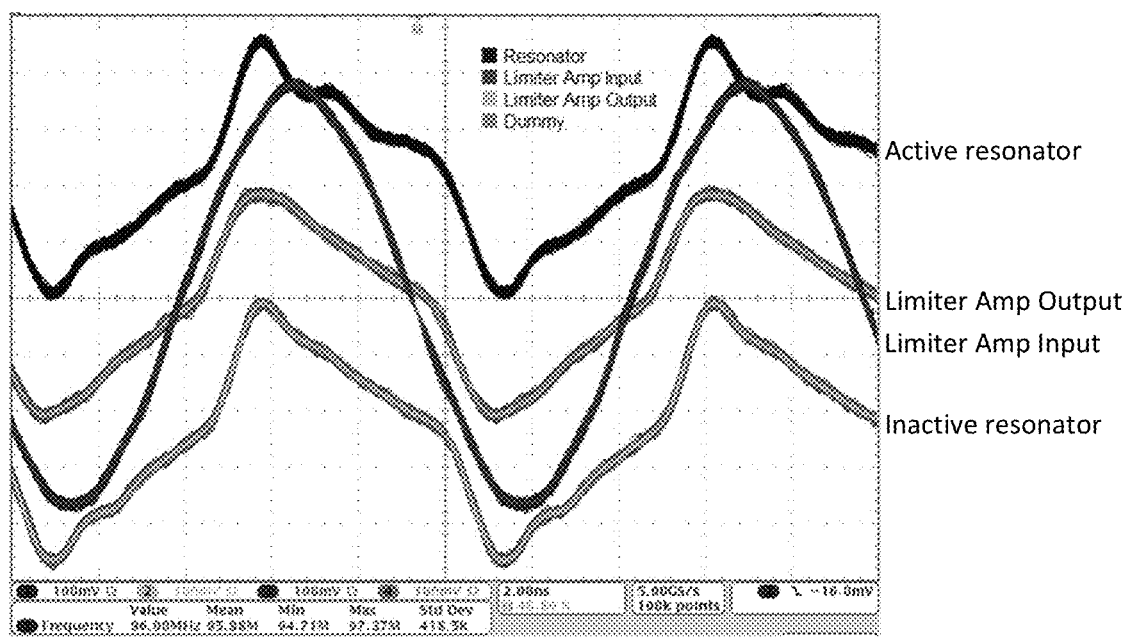
FIGS. 12A-12B show oscilloscope measurements for an exemplary single-port ST-90° rotated X-cut quartz resonator/sensor oscillator ($F_s$=99 MHz).
Figure 12B:
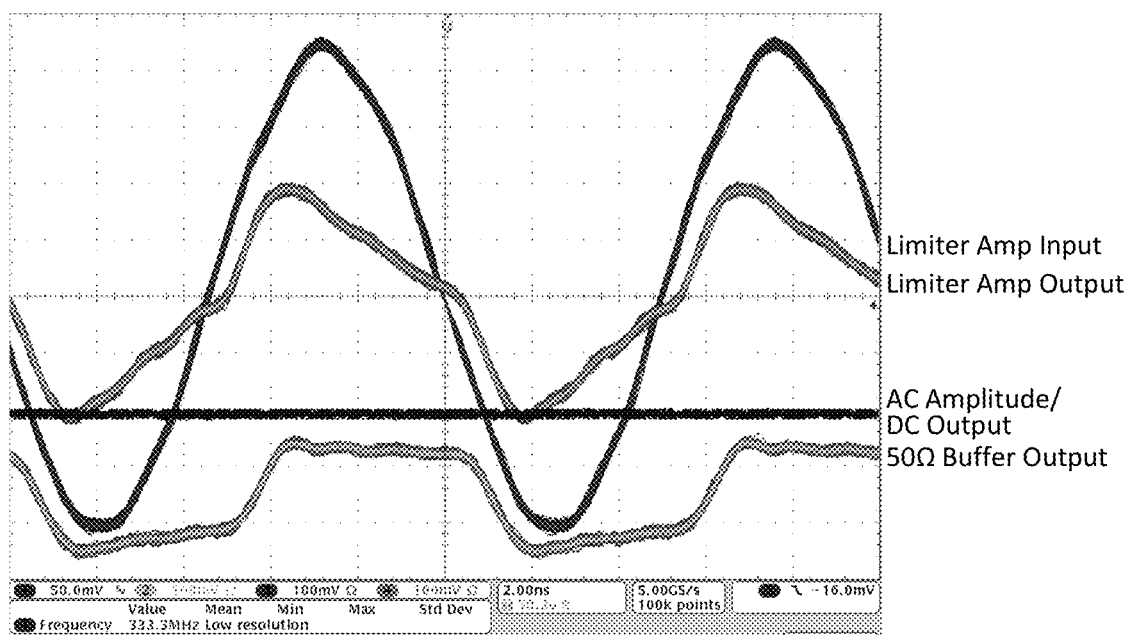
Figure 13A:
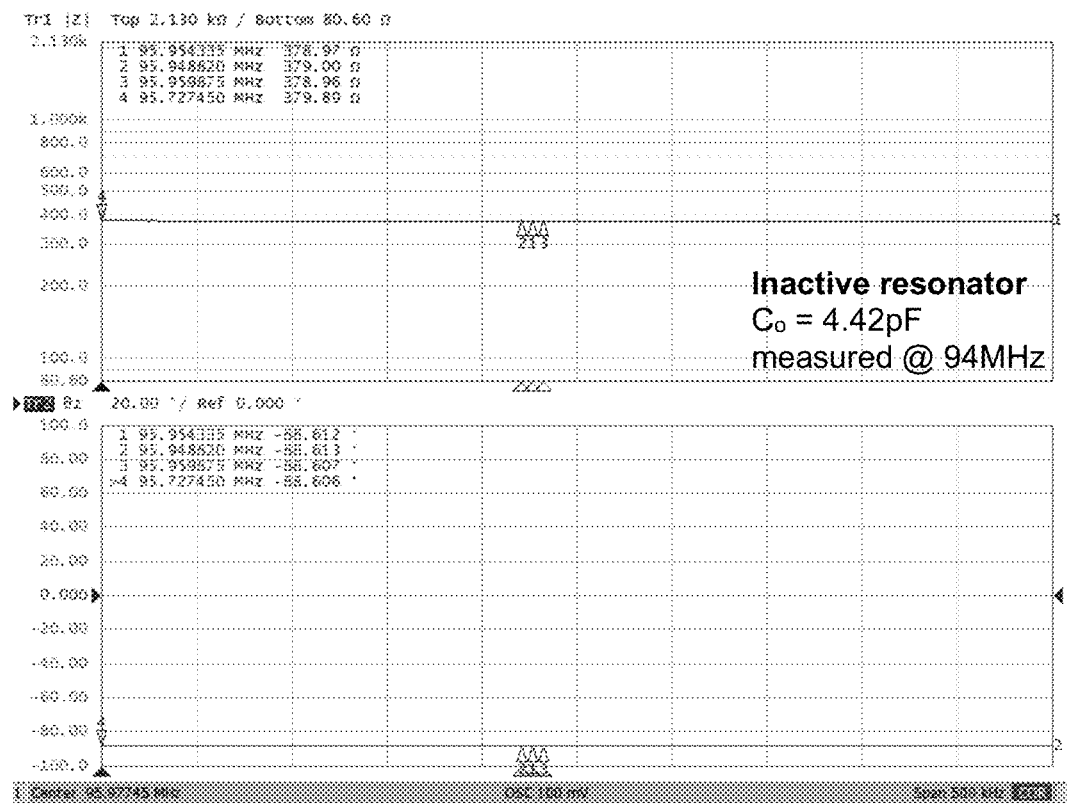
FIGS. 13A-13B show oscilloscope measurements for an exemplary single-port resonator/sensor oscillator measured at 94 MHz ($F_s$=96 MHz, Z=136Ω near $F_s$). X-axis shows 50 kHz/Div.
Figure 13B:
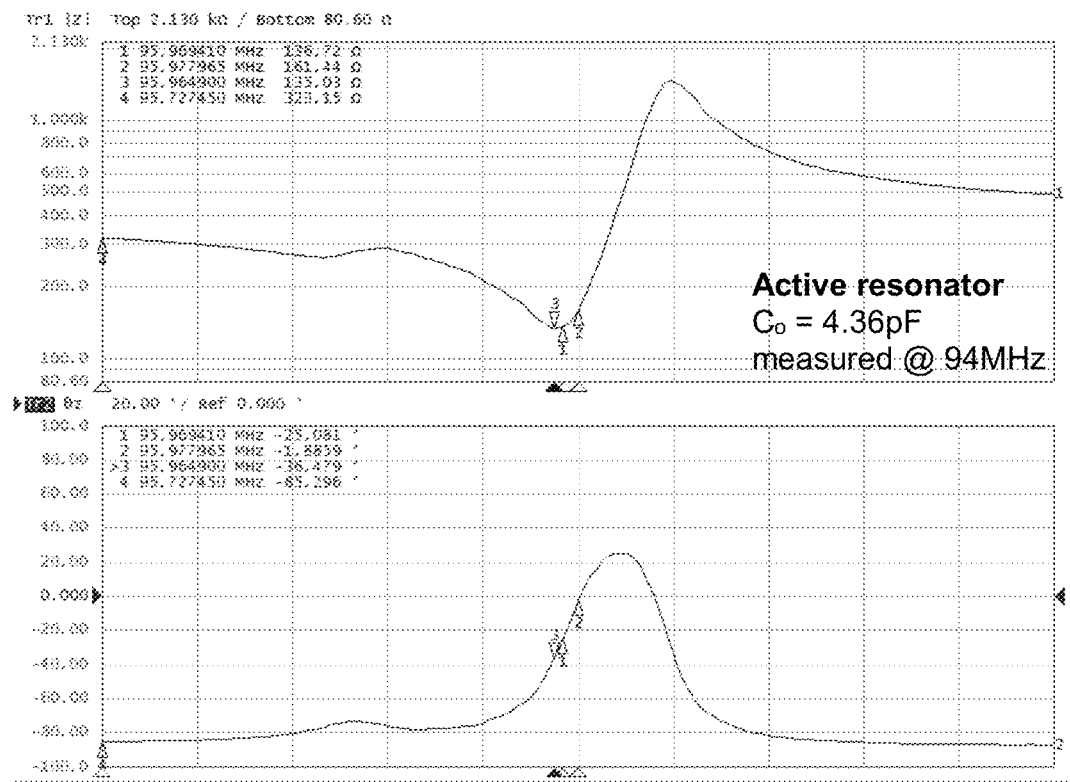
Figure 14A:
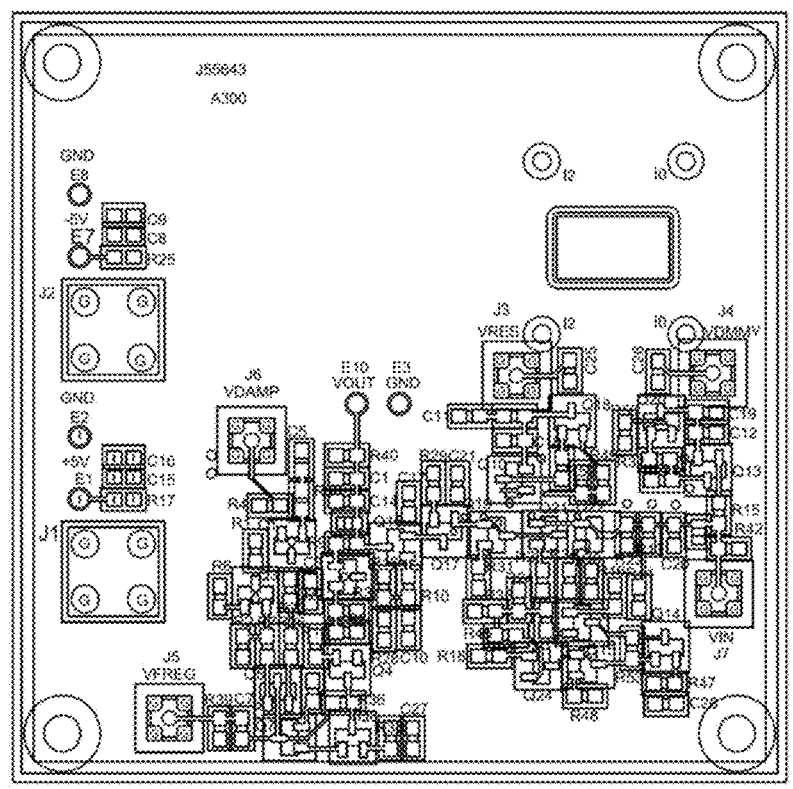
FIGS. 14A-14B show (A) a top view and (B) a bottom view of a circuit layout for a single-port resonator.
Figure 14B:
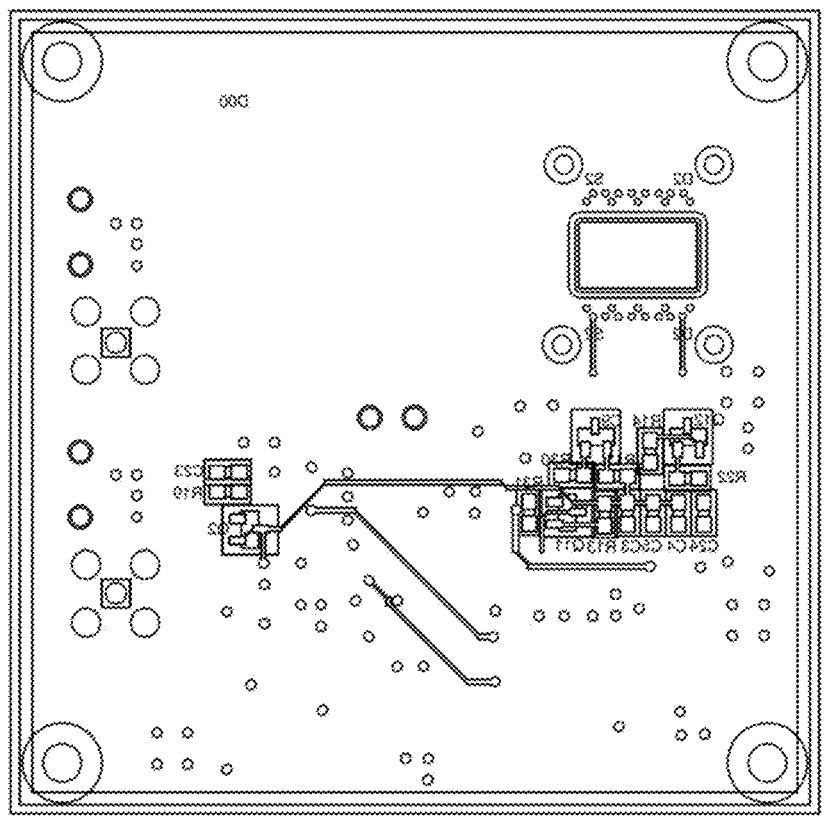
Figure 15:
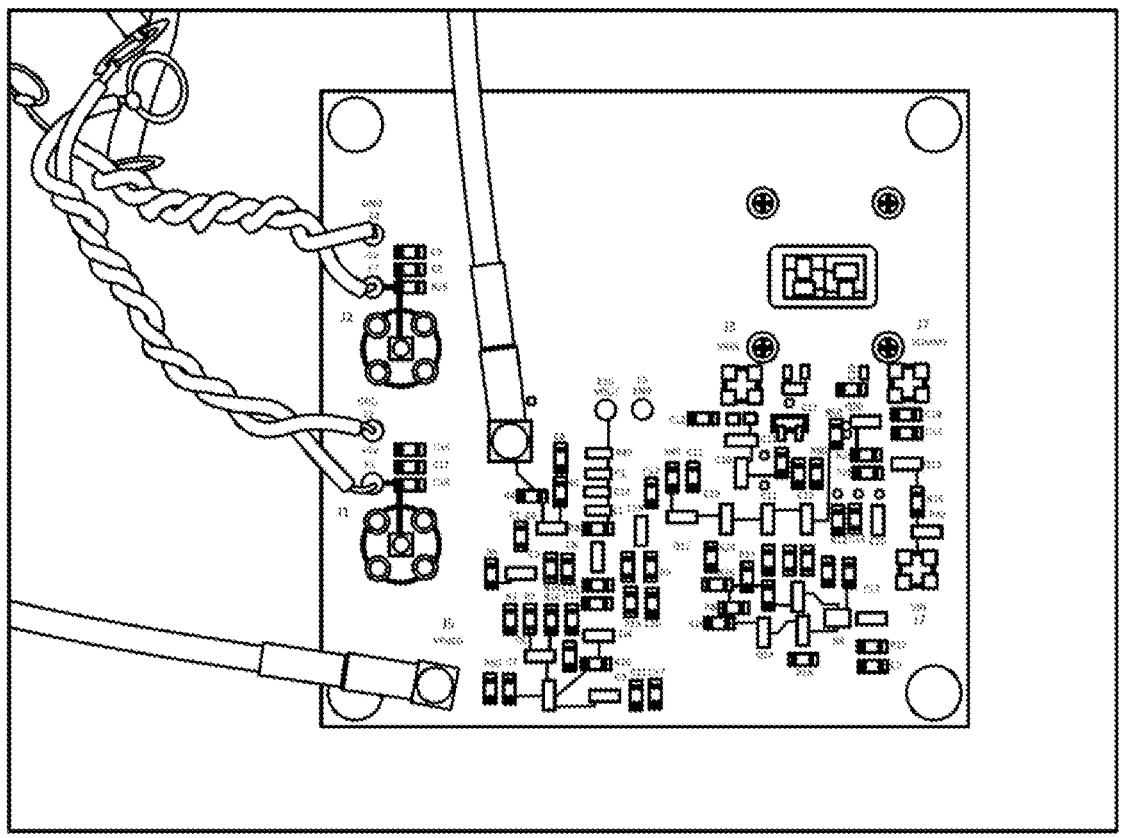
FIG. 15 shows an exemplary printed circuit board for use with an active resonator and inactive resonator (dashed box).

FIGS. 7A-7C show additional embodiments of limiting amplifiers having two gain stages to allow a wide-range of gain and limiting parameters (FIG. 7B) or a single gain stage having less transistors, which can allow for operation at higher frequency with lower operating resonator loss range (FIG. 7C). FIG. 8 shows an exemplary oscillator circuit employing a two-stage gain limiting amplifier.

A plurality of transistors can be provided in any useful configuration. In one embodiment, a second transistor has its input connected to the input of a first transistor and further connected to the output of a limiting amplifier, which is located in a feedback loop between the inverting output of the first transistor and the inputs of both transistors to provide the positive feedback necessary for oscillation of the resonator(s).

A resonant tank circuit can be employed, e.g., a low-Q tank circuit that is used to connect the oscillator circuit to a power supply. In one instance, the inverting output of the first transistor can be connected to a resonant tank circuit to suppress oscillation of the resonator at frequencies other than near the series resonance. This resonant tank can be configured to peak the gain of the tuned gain stage in a desired frequency range near the series resonance frequency $F_s$ and helps to reject unwanted modes of oscillation. The circuit can further include a current source provided between the non-inverting transistor output and an electrical ground for direct-current (dc) biasing of the transistor.

The oscillator circuit can employ one or more current mirrors for providing current components. In one embodiment, the current mirror provides dc and/or alternating-current (ac) current components at the non-inverting output of a transistor (e.g., a first transistor having a non-inverting output connected to an active resonator), with the ac current component being equal in magnitude and phase to a current flow through the shunt capacitance associated with the active resonator at the frequency of oscillation. This ac current component effectively cancels out any shunt of the active resonator due to the shunt capacitance by providing all the current flow through the shunt capacitance. The value of this ac current component is determined by an inactive resonator (e.g., as described herein). Those skilled in the art will understand that there are many different ways of forming current mirrors depending on the particular type of circuit elements used (e.g., NPN or PNP bipolar transistors, field-effect transistors, or cascode devices) and other considerations (e.g., temperature compensation).

Current sources are preferably provided within the oscillator circuit at the non-inverting outputs of each transistor (e.g., in parallel with the active resonator and/or in parallel with the inactive resonator) to establish dc bias levels for these transistors. The functional elements of the oscillator circuit (e.g. the first and second transistors, the limiting amplifier, and the current mirror) can be optionally formed as an integrated circuit (IC).

Those skilled in the art will understand that other circuit designs can be formed based on the teachings of the present invention for operating at the same or different frequencies, and for operating at the same or a different supply voltage. Furthermore, those skilled in the art will understand that the oscillator circuit of the present invention can be formed with other types of transistors, including field effect transistors.

Those skilled in the art will also understand that all or part of the oscillator circuit of the present invention can be formed as a discrete circuit, as a hybrid circuit or as an IC.

Embodiments of the oscillator circuit of the present invention can be formed using either bipolar transistors or field-effect transistors (FETs). When the oscillator circuit is formed as an IC, certain components (e.g., tank circuit) can be outboard to the IC to allow adaptation of the IC to many different types of applications, or to different types and sizes of piezoelectric crystals.

The circuitry can employ any useful components (e.g., described herein, such as one or more amplifiers, transistors, current mirrors, tank circuits, follower circuits, etc.) configured to provide an output signal that compensates for the non-zero shunt capacitance of the active sensor. Such compensation can employ an inactive sensor, which possesses all the electrical characteristics of the active sensor but lacks the ability to effectively propagate an acoustic wave.

Resonators

A resonator (e.g., an active resonator) can include an acoustic cavity configured to store mechanical energy from the acoustic wave. In some embodiments, the cavity is formed by employing one or more reflector regions (e.g., by use of reflectors, such as Bragg gratings). The cavity stores the mechanical energy from the multi-pass wave. Because acoustic standing waves of the resonator can reflect back and forth a plurality of times (e.g., about 100 times or more) through the cavity in the process of achieving resonance, the resonator has enhanced sensitivity (e.g., a greater sensitivity than a sensor employing a SH-SAW delay-line that lacks the acoustic cavity).

In one non-limiting instance, the active and inactive resonator can be formed from the same piezoelectric material, as well as possess the same electrode design, reflector region, optional guide layer, etc. However, the active resonator can be electrically connected to launch a shear horizontal surface acoustic wave along a crystal orientation that sufficiently propagates that wave, whereas the inactive resonator can be electrically connected along a crystal orientation that does not sufficiently propagate a shear horizontal surface acoustic wave. For example, if the piezoelectric material is ST-quartz, the shear-horizontal leaky surface acoustic wave (SH-LSAW) mode propagates along the 90° rotation to the axis (ST-90° X), and a weak Rayleigh mode propagates along the X-axis (ST-X), in which these two acoustic modes are separated in frequency by a factor of about 1.5 times. Thus, an active resonator can include a ST-quartz substrate configured to propagate a SH-LSAW along the 90° rotation to the X-axis, and the inactive resonator can include a ST-quartz substrate configured to propagate a Rayleigh wave along the X-axis.

Any other useful configuration or type of piezoelectric substrates can be employed, with the general requirement that an acoustic mode of the active resonator can be distinguished or separated from the acoustic mode of the inactive resonator. For instance, different materials will possess different waves along different crystal orientations. Thus, in one embodiment, an active resonator can include a piezoelectric material cut a first crystal orientation, and an inactive resonator can include that same piezoelectric material cut at a second crystal orientation that is different than the first crystal orientation. In another embodiment, the crystal cut and material are the same for the active and inactive resonators, but the electrode regions are deposited along different axes of the crystal orientation, thereby providing differing directions of wave propagation along different crystal axes.

The active area of a resonator can be disposed in proximity to the acoustic cavity. In this way, changes occurring in proximity to the active area can be detected by a change in an acoustic parameter, such as resonant frequency, amplitude, etc. In one instance, the active area can include immobilized cells, and changes to the cells can result in an environmental change (e.g., growth of cells within the active area, thereby providing an increase in mass; or inhibition of cells within the active area, thereby providing a decrease in mass) to the cavity. In turn, these environmental changes can either increase or decrease the velocity of the acoustic waves within the cavity, which translates to a resonant frequency shift that can be measured electrically.

In another instance, specificity for a particular target can be imparted by capture agents deposited within the active area. Binding of a target to the capture agent results in an environmental change (e.g., a mass change) to the cavity, where such binding decreases the velocity of the acoustic waves traveling within the acoustic cavity. This decrease in velocity then translates to a resonant frequency shift, which can be measured electrically.

An electrode region can include a transmitting transducer, which launches the acoustic wave by applying an electrical distribution field to a piezoelectric substrate; and the reflection region (e.g., including a plurality of reflectors) confines the wave within a cavity. In particular embodiments, the reflection region(s) are disposed outside of a periphery of the electrode region, thereby confining the wave and minimizing loss into the surrounding substrate. The electrode region can further include a receiving transducer, which detects the acoustic wave and transduced the mechanical wave into an electrical signal by inverse piezoelectrical coupling.

The positions and configuration of the electrode regions and reflector regions can be optimized. In one instance, the reflector region(s) can be arranged in any useful location with respect to the electrode region. For example, the electrode region can include one or more transducers, which in turn are arranged to provide an acoustic wave that propagates along a first direction. To effectively isolate and confine that wave, the reflection region can be arranged to interfere and reflect the acoustic wave a multiple of times within an active area. In one instance, the reflector region has a first reflective edge, and this edge is positioned to be perpendicular to the first direction (i.e., the propagation direction of the acoustic wave). Furthermore, to minimize destructive interference and maximize reflection, the reflector region can be positioned to be in proximity to an edge of the electrode region (e.g., separated by a distance d that is a fractional portion of the characteristics acoustic wavelength $\lambda$, such as $\pm\frac{1}{8}\lambda$, $\pm\frac{1}{4}\lambda$, $\pm\frac{3}{8}\lambda$, $\pm\frac{1}{2}\lambda$, $\pm\frac{3}{4}\lambda$, etc.).

The resonator can be configured to operate at any useful frequency $f_O$. Useful frequencies can include frequencies from about 80 MHz to about 3 GHz, such as of from 80 MHz to 200 MHz, 80 MHz to 300 MHz, 80 MHz to 375 MHz, 80 MHz to 450 MHz, 80 MHz to 600 MHz, 80 MHz to 750 MHz, 80 MHz to 1 GHz, 80 MHz to 2 GHz, 80 MHz to 2.5 GHz, 100 MHz to 200 MHz, 100 MHz to 300 MHz, 100 MHz to 375 MHz, 100 MHz to 450 MHz, 100 MHz to 600 MHz, 100 MHz to 750 MHz, 100 MHz to 1 GHz, 100 MHz to 2 GHz, 100 MHz to 2.5 GHz, 100 MHz to 3 GHz, 200 MHz to 300 MHz, 200 MHz to 375 MHz, 200 MHz to 450 MHz, 200 MHz to 600 MHz, 200 MHz to 750 MHz, 200 MHz to 1 GHz, 200 MHz to 2 GHz, 200 MHz to 2.5 GHz, 200 MHz to 3 GHz, 350 MHz to 450 MHz, 350 MHz to 600 MHz, 350 MHz to 750 MHz, 350 MHz to 1 GHz, 350 MHz to 2 GHz, 350 MHz to 2.5 GHz, 350 MHz to 3 GHz, 400 MHz to 450 MHz, 400 MHz to 600 MHz, 400 MHz to 750 MHz, 400 MHz to 1 GHz, 400 MHz to 2 GHz, 400 MHz to 2.5 GHz, 400 MHz to 3 GHz, 425 MHz to 450 MHz, 425 MHz to 600 MHz, 425 MHz to 750 MHz, 425 MHz to 1 GHz, 425 MHz to 2 GHz, 425 MHz to 2.5 GHz, 425 MHz to 3 GHz, 450 MHz to 600 MHz, 450 MHz to 750 MHz, 450 MHz to 1 GHz, 450 MHz to 2 GHz, 450 MHz to 2.5 GHz, 450 MHz to 3 GHz, 475 MHz to 600 MHz, 475 MHz to 750 MHz, 475 MHz to 1 GHz, 475 MHz to 2 GHz, 475 MHz to 2.5 GHz, 475 MHz to 3 GHz, 500 MHz to 600 MHz, 500 MHz to 750 MHz, 500 MHz to 1 GHz, 500 MHz to 2 GHz, 500 MHz to 2.5 GHz, 500 MHz to 3 GHz, 550 MHz to 600 MHz, 550 MHz to 750 MHz, 550 MHz to 1 GHz, 550 MHz to 2 GHz, 550 MHz to 2.5 GHz, 550 MHz to 3 GHz, 600 MHz to 750 MHz, 600 MHz to 1 GHz, 600 MHz to 2 GHz, 600 MHz to 2.5 GHz, or 600 MHz to 3 GHz. In alternative embodiments, the frequency $f_O$ is limited by lithographic limits (e.g., up to about 2.5 GHz, in one or more embodiments).

Piezoelectric Substrate

The piezoelectric substrate can include any useful piezoelectric material. Exemplary piezoelectric materials include lithium tantalate ($LiTaO_3$), lithium niobate ($LiNbO_3$), potassium niobate ($KNbO_3$), quartz ($SiO_2$, such as an a-$SiO_2$), langatate ($La_3Ga_{5.5}Ta_{0.5}O_{14}$), langasite ($La_3Ga_5SiO_{14}$), langanite ($La_3Ga_{5.5}Nb_{0.5}O_{14}$), lead zirconate titanate (Pb[$Zr_xTi_{1-x}$]$O_3$, where $0 \leq x \leq 1$, such as $PbZr_{0.52}Ti_{0.48}O_3$), cadmium sulfide (CdS), berlinite ($AlPO_4$), gallium phosphate ($GaPO_4$), lithium iodate ($LiIO_3$), lithium tetraborate ($Li_2B_4O_7$), bismuth germanium oxide ($Bi_{12}GeO_{20}$), zinc oxide (ZnO), aluminum nitride (AlN), etc., provided in any useful orientation, e.g., 36° YX $LiTaO_3$, Y+36° cut $LiTaO_3$, 0° X-cut $LiTaO_3$, 128° XY $LiNbO_3$, 41° YX $LiNbO_3$, 64° YX $LiNbO_3$, rotated Y-cut quartz, ST-X cut quartz, or 36° Y quartz.

In some embodiments, the piezoelectric substrate is obtained from a particular crystal cut that propagates and supports SH waves or leaky SH waves. In other embodiments, the electrode region is arranged on that particular crystal cut of the piezoelectric substrate to effectively launch the SH wave. In other embodiments, the piezoelectric substrate includes a piezoelectric crystal layer that is approximately thicker than the Love wave penetration depth, in which the crystal layer is optionally disposed on a non-piezoelectric substrate. Such piezoelectric substrate can include one or more electrode regions (e.g., any described herein), in which the components of the electrode regions are arranged to provide a useful acoustic propagation path along any directional axis that provides a useful acoustic wave (e.g., an SH acoustic wave).

A layer (e.g., a guide layer or a surface modified layer) can overlie a top surface of the piezoelectric substrate, or a portion of this top surface. Such a layer can be used for any useful purpose, e.g., to propagate a Love wave confined to that layer, to present one or more capture agents to a sample, and/or to provide a plurality of immobilized cells (e.g., bacterial cells) to a sample. The layer can be formed of any useful material, such as a polymer (e.g., a polystyrene, a polyimide, a polynorbornene, a perfluoropolymer, a poly(xylylene) (e.g., parylene C or poly(chloro-p-xylylene)), poly(dimethylsiloxane), or a polymethylmethacrylate (PMMA)), an oxide (e.g., ZnO), a silane, or a dielectric (e.g., a silicon oxide, such as $SiO_2$; a silicon oxynitride, e.g., SiON; or a silicon nitride, such as $Si_3N_4$, which can optionally including one or more dopants). The layer can be of any useful thickness, such as of from about 0.05 μm to about 20 μm (e.g., from 0.05 μm to 1 μm, 0.05 μm to 2 μm, 0.05 μm to 5 μm, 0.05 μm to 10 μm, 0.1 μm to 1 μm, 0.1 μm to 2 μm, 0.1 µm to 5 µm, 0.1 µm to 10 µm, 0.1 µm to 20 µm, 0.5 µm to 1 µm, 0.5 µm to 2 µm, 0.5 µm to 5 µm, 0.5 µm to 10 µm, 0.5 µm to 20 µm, 1 µm to 2 µm, 1 µm to 5 µm, 1 µm to 10 µm, 1 µm to 20 µm, 2 µm to 5 µm, 2 µm to 10 µm, 2 µm to 20 µm, 5 µm to 10 µm, or 5 µm to 20 µm).

Any method known in the art for depositing a layer may be used, e.g., such as plasma enhanced chemical vapor deposition. On top of the layer, a thin layer of a non-reactive liquid silicone material (e.g., a hexamethyldisilazane, oligodialkylsiloxane, polydialkylsiloxane, or other silicone, such any silanizing compound described herein) or any other non-reactive liquid may be used to prepare the surface for further functionalization. The layer, or a portion thereof, can include one or more linkers, binding agents, cells, and/or capture agents (e.g., any described herein).

Electronics Module

The electronics module can provide one or more electrical connections to the resonator (e.g., the electrode region of the resonator). In particular, the electronics module can include a portion (e.g., a recessed portion) configured to accommodate the resonator (e.g., active resonator and inactive resonator), as well as include one or more electrical connections (e.g., pins, connectors, etc.) to the bond pad(s), contact pad(s), bond line(s), electrode(s), and reflector(s).

The electronics module can include any useful circuit components, such as an oscillator circuit (e.g., any described herein, as well as a Pierce circuit, a Colpitts circuit, or a Clapp circuit including an amplifier or a transistor, such as a bipolar junction transistor); one or more attenuation networks (e.g., including one or more circuit components to reduce the amplitude of a signal, such as by use of one or more resistors); one or more filters (e.g., a frequency selective, a high pass filter, a low pass filter, or a phase shifting filter); one or more amplifiers (e.g., transistors); one or more impedance matching networks (e.g., including one or more circuit components configured to match the impedance of the resonator to another electronic component, in which exemplary impedance matching networks can include an inductor with an optional resistor in series with the non-grounded electrode(s) of the resonator); and/or one or more coupling networks (e.g., configured to provide an output, such as a measured frequency shift).

A desired output (e.g., a frequency shift) can be measured in any useful manner, such as by an oscillator circuit. Any useful oscillator circuit can be employed to detect the one or more outputs. Exemplary circuits, components, and methodologies are described in U.S. Pat. Nos. 3,836,873, 3,878,481, 4,570,132, 5,416,448, 6,169,459, 6,169,461, 6,624,708, or 9,627,602 and U.S. Pat. Pub. Nos. 2006/0055480 or 2006/0114072, as well as Kelly R D, "Electronic circuit analysis and design by driving-point impedance techniques," *IEEE Trans. Educ.* 1970; E-13:154-67; Martin S J et al., "Resonator/oscillator response to liquid loading," *Sandia Report No. SAND*97-0124J, 1997 (26 pp.); Martin S J et al., "Sensing liquid properties with thickness-shear mode resonators," *Sandia Report No. SAND*94-0079J, 1993 (36 pp.); Martin S J et al., "Sensing in liquids using quartz resonators: mass accumulation and liquid properties," *Sandia Report No. SAND*93-0311A, 1993 (1 p.); Spates J J et al., "Resonator/oscillator response to liquid loading," *Sandia Report No. SAND*94-1310C, 1994 (11 pp.); Wessendorf K O, "Driving point impedance circuit analysis techniques," *Sandia Report No. SAND*92-2832C, 1993 (81 pp.); Wessendorf K O, "High-frequency voltage-controlled-oscillator for use with inverted-mesa quartz resonators," *Sandia Report Nos. SAND*96-0019A, 1996 (1 p.) and SAND96-0019C, 1996 (9 pp.); Wessendorf K et al., "Oscillator design techniques allow high-frequency applications," *Sandia Report No. SAND*98-1839J, 1998 (6 pp.); Wessendorf K et al., "Oscillator design techniques allow high frequency applications of inverted mesa resonators," sss-mag.com/pdf/saosc.pdf (8 pp.); Wessendorf K O, "Quartz oscillator analysis," *Sandia Report No. SAND*87-0311, 1988 (31 pp.); Wessendorf K O, "The active-bridge oscillator," *Sandia Report Nos. SAND*98-0203A, 1998 (1 p.) and SAND98-1558C, 1998 (9 pp.); Wessendorf K O, "The active-bridge oscillator for use with liquid loaded QCM sensors," *Sandia Report No. SAND*2001-0097A, 2001 (1 p.); Wessendorf K O, "The active-bridge oscillator for use with liquid loaded QCM sensors," *Sandia Report No. SAND*2001-1944C, 2001 (6 pp.); and Wessendorf K O, "The Lever oscillator for use in high resistance resonator applications," *Sandia Report No. SAND*93-0145C, 1993 (7 pp.), each of which is incorporated herein by reference in its entirety.

In one instance, an output of the resonator is connected to the gain device (e.g., an amplifier, such as a bipolar junction transistor), and the output of the gain device is connected to its input. In this way, an oscillating signal is established, which in turn can be used to resolve the resonant frequency shift of the resonator. In use, a change in mass (resulting from binding a target) shifts the resonant frequency of the resonator, and this shift in resonant frequency can be detected with an oscillator circuit.

Additional electronic components can include a frequency mixer, a frequency doubler, a frequency demultiplier, a frequency counter, a network analyzer, a capacitor, a transistor, etc., in which any components can be provided in any useful manner (e.g., as an integrated circuit). Other design considerations are described in Schmitt R F et al., "Rapid design of SAW oscillator electronics for sensor applications," *Sens. Actuat. B* 2001; 76:80-5; Martin S J et al., "Characterization of SH acoustic plate mode liquid sensors," *Sens. Actuat.* 1989; 20:253-68; and Grate J W et al., "Acoustic wave microsensors," *Anal. Chem.* 1993; 65(21):940A-8A, each of which is incorporated herein by reference in its entirety.

EXAMPLES

Example 1: Impact of Shunt Capacitance

The equivalent circuit of a 1-port acoustic resonator ($Y_1$) is shown in FIG. 1. $C_o$ is the shunt capacitance, $R_m$ is the motional resistance, $L_m$ is the motional inductance, and $C_m$ is the motional capacitance. This motional arm of the resonator is due to the piezoelectric characteristics of the resonator.

Non-zero shunt capacitance alters the impedance by shifting the location of the minimum and the zero phase crossing while causing significant distortion. In some cases, there may not be a zero phase crossing (FIGS. 2A-2B). The distortion for non-zero shunt capacitance becomes increasingly worse as the resonator loss increases (i.e., low Q). The shunt capacitance $C_o$ is always a non-zero value due to the electrodes and the additional capacitance of the associated fixture or circuit substrate used for the sensor.

To obtain the true $F_s$ and resonator loss $R_m$, it is highly desirable to remove the shunt capacitance because more useful information can be generated by an oscillator or other measuring equipment. When $C_o$=0, the series resonance occurs exactly where the phase crosses zero at the minimum impedance or series resonance. This is because the resonance is now due to the combination of $L_m$-$C_m$, and $Y_1$ appears as $R_m$ at the series resonance frequency $F_s$ when $C_o$ is a very large reactance compared to $R_m$. At $F_s$, the sensor is most sensitive to surface changes. Resonator-sensor applications require monitoring $F_s$ and $R_m$, as this provides information relating to mass change ($\Delta m$) and viscosity-density of the measured sample ($R_m$ or Q). It is important to note that the location of $F_s$ for $C_o$=0 may differ from the location of the quality factor Q due to the phase shift contribution from $C_o$:

$$Q_s = \frac{F_s}{2} \frac{d\angle Z_{11}}{df} = \frac{2\pi F_s L_m}{R_m}. \tag{3}$$

where $Z_{11}$ is the 1-port impedance, $F_s$ is the series resonance frequency, $R_m$ is the motional resistance, and $L_m$ is the motional inductance. Equivalently, Q can be computed from $L_m$ and $R_m$.

Example 2: Exemplary Active Shunt Capacitance Cancelling Oscillator (ASCCO)

An oscillator circuit was developed to remove the impedance contribution of $C_o$, allowing the acoustic contributions to be measured by the oscillator. This method is called Active Shunt Capacitance Cancelling Oscillator (ASCCO). The oscillator tracks the true resonant frequency $F_s$ and thus provides the best sensitivity to surface changes, such as mass and viscosity•density, which can be critical for sensor applications.

When $C_o$ is removed, a series resonant oscillator circuit is formed that "servos" the zero-phase point of this effective resonator impedance, which is determined the motional arm of the resonator structure. The zero impedance phase of this motional arm occurs at the $F_s$ of the resonator, where the shunt capacitance complicates finding the "true" $F_s$ of a resonator since this frequency depends on this shunt capacitance and the resonator loss, $R_m$.

Extracting the value of $R_m$ from a series resonant oscillator that removes the shunt capacitance at series resonance simplifies the resonator impedance to $R_m$. This does not require deconvolving the shunt capacitance. The active shunt capacitance cancelling oscillator allows the above conditions by removing any shunt capacitance across the resonator. Removal is accomplished by supplying the circuit with an equal "dummy" capacitance that generates a cancelling current used in the oscillator to cancel electronically the non-desired resonator shunt capacitance. This circuit also supplies an output signal (e.g., a dc voltage) that is proportional to the amplitude of oscillation which is also proportional to $R_m$. At the series resonance frequency $F_s$ of $L_m$-$C_m$, only $R_m$ remains and $C_o$=0 or $C_o$ is a very large reactance compared to $R_m$.

Figure 4A:
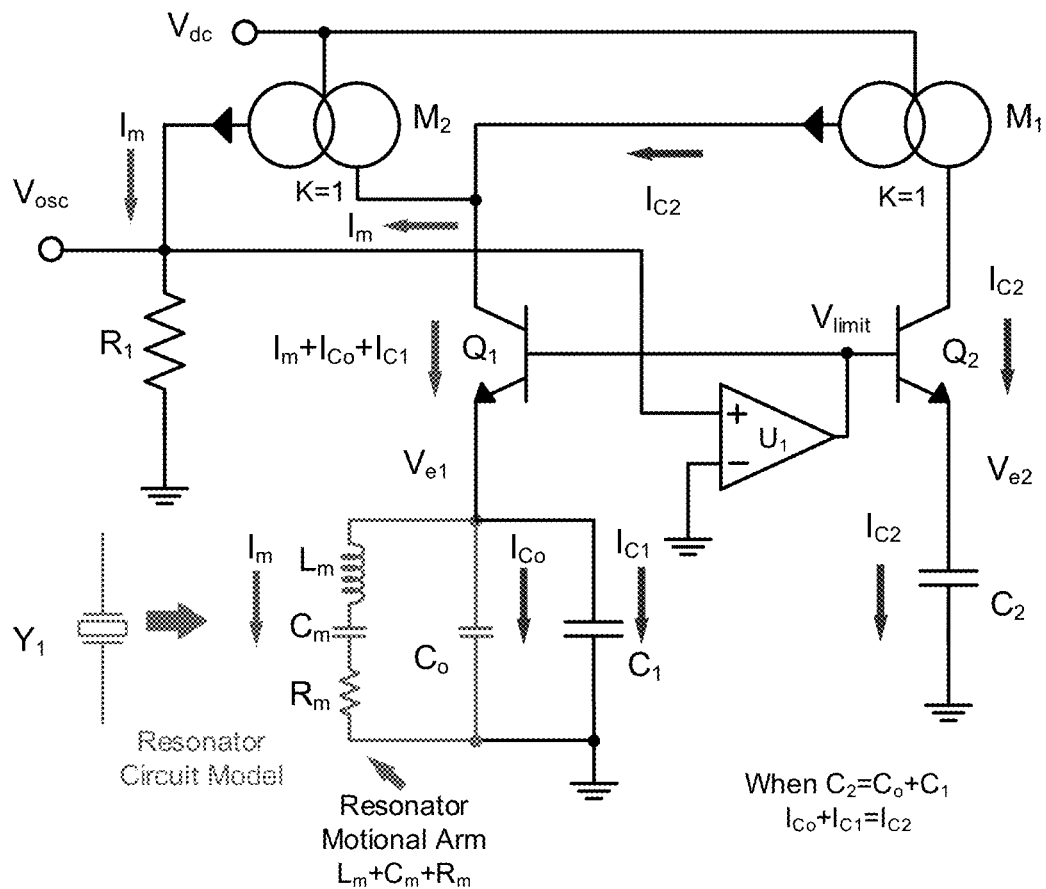
FIGS. 4A-4B show (A) another exemplary oscillator circuit and (B) a simplified oscillator with active shunt $C_o$ removal.
Figure 4B:
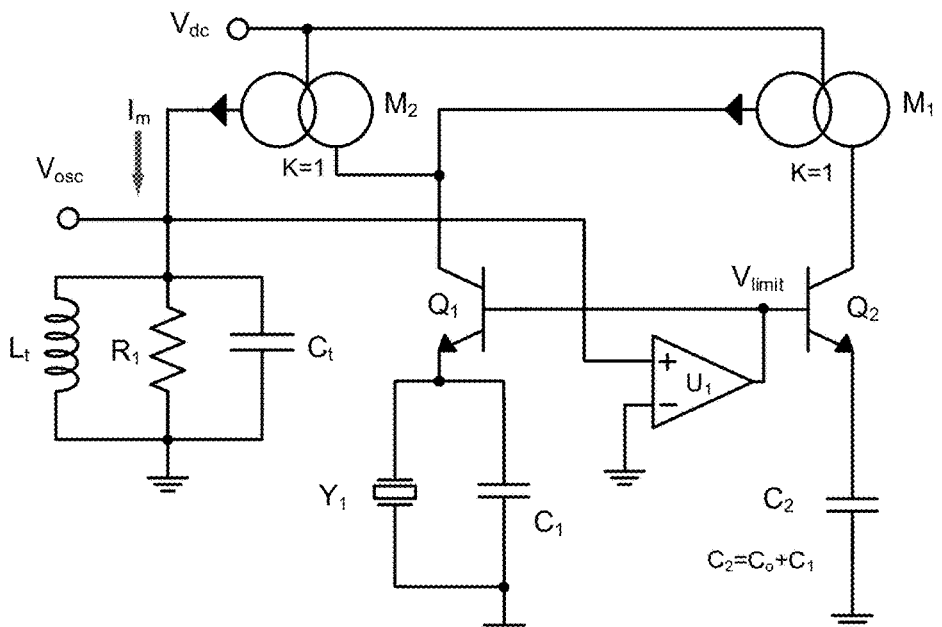

An exemplary circuit is shown in FIG. 4A. This oscillator uses the emitters of $Q_1$ and $Q_2$ as active ports to convert impedances of the resonator with shunt capacitance $C_1$ (emitter of $Q_1$) and a dummy capacitance $C_2$ (emitter of $Q_2$) into currents that will be summed at an output node. In this way, the equivalent circuit functions as an oscillator, where the frequency of oscillation only depends on the motional arm of the resonator circuit. This is true when the output impedance of $Q_1$ and $Q_2$ are less than the impedances at these nodes, or the transistors are working as very good voltage followers, meaning the emitter voltages, $V_{e1}$ and $V_{e2}$ are very close to the output voltage of the limiting amplifier $U_1$.

In one non-limiting instance, the limiting amplifier is a non-inverting amplifier with gain ($GU_1$) of approximately 2.25, and the output is fixed to limit to an amplitude a predetermined voltage (e.g., about 0.4 Vp-p). This voltage is independent of the input amplitude ($V_{osc}$) after this level is reached. To cancel the effects of the shunt capacitance across the resonator ($C_o$+$C_1$), the value of $C_2$ needs to equal $C_o$+$C_1$. As shown in FIG. 4A, the current mirror $M_1$ passes on a copy of the dummy capacitance current $I_{C2}$ to current mirror $M_2$, where the summing of the two current legs $Q_1$ and $Q_2$ cancel the shunt capacitance currents ($I_{Co}$, $I_{C1}$, $I_{C2}$) and leaves only the motional arm current $I_m$.

The resulting motional arm current $I_m$ generates an output signal (e.g., voltage $V_{osc}$ at node $R_1$). Resistance $R_1$ is real and equal to 340$\Omega$, and the gain of $U_1$ is also real. Thus, the loop gain $A_v$ is $R_1(GU_1)/(XL_m+XC_m+R_m)$, where $XL_m$ and $XC_m$ are the reactance of $L_m$ and $C_m$, respectively. The circuit will oscillate when the loop gain is greater than one and the oscillation frequency occurs where the loop function is real, or a radians. This condition only occurs when $XC_m$+$XL_m$=0 or when $F_{osc}$=$1/(2\pi\sqrt{L_m C_m})$. The loop gain equation at this frequency is $R_1(GU_1)/R_m$. The voltage at node $V_{osc}$ is simply the limiting voltage of U1 (e.g., 0.4Vp-p) multiplied by the ratio ($R_1/R_m$). In reality, the resistor $R_1$, which can be relatively large, is shunted with capacitance also. Thus, in practice, at the node $V_{osc}$, $R_1$ uses a parallel tank circuit to allow a wider possible range of operational frequencies and/or selection of a resonator overtone, if desired.

In FIG. 4B, a simplified version of an exemplary active capacitance canceling oscillator is shown. The output tank, at $V_{osc}$, is a parallel tank circuit where $R_1$, $L_t$-$C_t$ is a relatively low Q parallel tank circuit, where $L_t$ is chosen to be resonant with $C_t$ at the desired resonator frequency. At this frequency, the tank impedance is simply $R_1$, and the previous equations and theory all apply. The amplitude of the oscillation is taken from a node inside $U_1$, which provides a half wave rectification of the node $V_{osc}$. This signal can range from a low to high-level sine wave, depending on the resonator loss and other parameters. The rectified waveform can be buffered and filtered to provide an output signal (e.g., a dc voltage) proportional to the amplitude of the oscillation voltage at $V_{osc}$. In one non-limiting instance, the oscillator operates with a series resistance of from about 10$\Omega$ to about 250$\Omega$. In other non-limiting instances, above about 300$\Omega$, the oscillate may fail to operate due to a decrease in the overall loop gain of the detection circuit.

To confirm the ASCCO circuit is removing the shunt capacitance and tracking the true series resonance, capacitance was added to the active and dummy oscillator ports in sequence. Adding a 2.5 pF capacitor to the active resonator port caused an equal but opposite frequency shift +30 ppm. Adding a 2.5 pF capacitor to the dummy or reference resonator port caused an equal but opposite frequency shift of –49 ppm. Both ports had an expected but small decrease in amplitude. Adding equal capacitors to both oscillator ports resulted in a negligible shift in the oscillator frequency of 2 ppm and the oscillator amplitude remained unchanged. This shows the ASSCO circuit is tracking the true series resonance frequency.

Example 3: Model Simulations of Exemplary Oscillator Circuit

An active shunt capacitance cancelling oscillator circuit was developed to provide for active shunt cancellation and then further optimized to minimize resonator loss and allow for additional gain. In particular, as seen in FIG. 8, the circuit included use of an improved limiting amplifier to provide additional gain and separation of design parameters. Furthermore, class AB follower circuits were employed to improve linearity. Low frequency model simulations are provided in FIGS. 9A-9F.

Example 4: Rapid Antimicrobial Susceptibility Determination Using Acoustic Resonance Acoustic wave devices continue to have wide-spread applications for biological and chemical sensing. Most acoustic sensors are used for identification of biological targets, rather than measuring the response to environmental challenges such as antibiotic exposure. In this approach, it is thought that antibiotics cause nanoscale changes in the mechanical and electrical properties of bacteria, which can be detected using an acoustic sensor.

Here, we show that *E. coli* growth and adsorption is challenged by the antibiotic kanamycin when monitored using a shear-horizontal leaky surface acoustic (SH-LSAW) wave resonator. This effect occurs on a time-scale of about 30 to 60 minutes. The acoustic sensors were based on shear-horizontal leaky surface acoustic waves (SH-LSAW) propagating on 90° X rotated ST-quartz (ST-Q; 0°, 132.75°, 0°) and 36° Y-cut lithium tantalate (36YLT; 0°, −54°, 0°). Such methods can be useful for determining antibiotic susceptibility of bacterial samples more rapidly than conventional methods, e.g., in order to speed the appropriate therapy and increase the survival rate of infected patients.

The measurements were performed using a new monitoring approach for acoustic and radiofrequency (RF) sensors. Of significance is the development of an active shunt capacitance cancelling oscillator (ASCCO) for resonator parameter extraction. This oscillator removes the contribution of the shunt capacitance from the acoustic resonators, allowing precise tracking of the series resonance frequency and monitoring of only the acoustic contributions to be measured and tracked accurately. This monitoring method avoids impedance distortion and phase shift problems associated with non-zero shunt capacitance, and such a method can have wide, general applicability to acoustic sensors and RF devices. Additional details follow.

Example 5: Acoustic Resonators and Biosensor Applications

Over the past 30 years, the emergence of drug resistant bacteria is overwhelming our ability to develop new antibiotics fast enough. Consider from 1940 to 1962, more than 20 new classes of antibiotics were marketed; however, since then only two new classes have reached the market (see, e.g., Coates A R et al., "Novel classes of antibiotics or more of the same?," *Br. J. Pharmacol.* 2011; 163(1):184-94). Though antibiotic analogues have kept pace with the emergence of resistant bacteria until 10-20 years ago, not enough analogues have reached the market. Recently, only two new antibiotics have been discovered: fidaxomicin, a narrow spectrum macrocyclic for *C. difficile* infections; and teixobactin, a new class of antibiotics with broad activity against gram-positive bacteria. Despite these advances, a rapid approach is needed to slow the emergence of resistant bacteria (e.g., gram negative) and prevent the spread of resistant infections by using efficacious antibiotics at the onset of infection.

It is increasing important to determine antimicrobial susceptibility on a rapid timescale (e.g., minutes). In this approach, it is thought that antibiotics cause nanoscale changes in the mechanical and electrical properties of bacteria that can be detected using acoustic sensors. Moreover, if the bacteria are susceptible to the antibiotic, nanoscale changes begin to occur within minutes of exposure. This approach is based on a recent finding that a mechanical method such as atomic force microscopy (AFM) can rapidly characterize bacterial metabolism and quantitatively screen in five minutes their response to antibiotics by covalently attaching ~600 bacteria to cantilevers with no incubation period (see, e.g., Longo G et al., "Rapid detection of bacterial resistance to antibiotics using AFM cantilevers as nanomechanical sensors," *Nat. Nanotechnol.* 2013; 8(7): 522-6; and Soon R L et al., "Atomic force microscopy investigation of the morphology and topography of colistin-heteroresistant *Acinetobacter baumannii* strains as a function of growth phase and in response to colistin treatment," *Antimicrob. Agents Chemother.* 2009; 53(12):4979-86).

In addition, a purely electrical method, impedance spectroscopy, can detect changes in bacterial capacitance due to antibiotic challenges within 2 hours at concentrations as low as 80 cfu/ml (see, e.g., Sengupta S et al., "A micro-scale multi-frequency reactance measurement technique to detect bacterial growth at low bio-particle concentrations," *Lab Chip* 2006; 6(5):682-92; and Malleo D et al., "Continuous differential impedance spectroscopy of single cells," *Microfluid. Nanofluidics* 2010; 9(2-3):191-8). These results suggest that detectable mechanical and electrical changes occur in bacterial cells during antibiotic exposure, which can enable much faster screening approaches than currently available.

Existing growth-based approaches currently require 12 hours to 21 days, especially for slow growing bacteria such as *Mycobacterium*. Determining antimicrobial susceptibility is of paramount importance since all antibiotics approved for use in patients today are derived from a limited number of types, or classes, of antibiotics that were discovered by the mid-1980s.

Acoustic resonators are able to detect mechanical and electrical properties simultaneously with a mass detection limit in the sub femtogram range. The mass sensitivity depends on the acoustic mode and typically improves with increasing frequency. For a SH-LSAW based resonator with a passivation layer, the mass sensitivity $S_m^f$ is a function of the acoustic velocities, densities, and thicknesses of the layers (for a resonator including a piezoelectric substrate, an overlayer (e.g., a guide layer) disposed above the substrate, and a thin layer of mass disposed above the thin film, see, e.g., Wang Z et al., "Sensitivity analysis for Love mode acoustic gravimetric sensors," *Appl. Phys. Lett.* 1994; 64(22):2940-2; and Wang Z et al., "Perturbation method for analyzing mass sensitivity of planar multilayer acoustic sensors," *IEEE Trans. Ultrason. Ferroelect. Freq. Contr.* 1996; 43(5):844-51):

$$S_m^f = \frac{1}{f_0} \lim_{\Delta m \to 0} \left[ \frac{f - f_0}{\Delta m} \right] \approx \frac{1}{f_0} \frac{\partial f}{\partial m} - \frac{\left(1 - \frac{V_{s_3}^2}{V_o^2}\right)}{\rho_2 h \cdot \left[1 + \frac{\sin(\beta_2 h)\cos(\beta_2 h)}{\beta_2 h} + \frac{\rho_1}{\rho_2} \cdot \frac{\cos^2(\beta_2 h)}{\beta_1 h}\right]}, \quad (1)$$

where f is the oscillation frequency at perturbed cases, $f_o$ is the frequency at unperturbed cases, $\Delta m$ is the perturbation of change in mass, Vo is the phase velocity of the acoustic mode at unperturbed cases, $V_{S_1}$ is the shear wave velocity in the thin layer of mass, $\rho_1$ is the density of the semi-infinite piezoelectric substrate, $\beta_2$ is the decay constant in the substrate, $\rho_2$ is the density of a thin overlayer, h is the height of the overlayer, and $\beta_2$ is the transverse propagation constant in the overlayer.

To improve mass sensitivity, the sensors are often designed to have an operating frequency in the MHz to GHz range; however, there are practical limits on the operating frequency due to photolithography, complexities of the monitoring circuit, electrical and acoustic losses, and associated parasitic contributions. For perspective, one bacterium has a mass of one picogram and one virus has a mass of one femtogram, thus achieving high mass sensitivity is paramount.

In this study, 1-port shear-horizontal leaky surface acoustic wave (SH-LSAW) resonator was designed in ST-Quartz at 100 MHz to enable the development of a method to remove the shunt capacitance from the resonators. ST-Quartz was chosen for its high quality factor (Q) and low temperature dependence to prototype the active shunt capacitance cancelling oscillator (ASCCO).

The SH-LSAW resonators were fabricated on ST-Quartz (0°, 132.75°, 0°) and also on 36° Y-cut lithium tantalate (36YLT) (0°, −54°, 0°) to access the SH-LSAW mode. The SH-LSAW mode was excited by depositing a thick metal layer with a high density such as tungsten, gold, or tantalum (see, e.g., Kadota M et al., "Resonator filters using shear horizontal-type leaky surface acoustic wave consisting of heavy-metal electrode and quartz substrate," *IEEE Trans. Ultrason. Ferroelect. Freq. Contr.* 2004; 51(2):202-10). For ST-Quartz, the SH-LSAW mode propagates at a 90° rotation to the axis (ST-90° X) with an electromechanical coupling ($K^2$) factor of 0.4%. The energy of the LSAW mode is concentrated in the structure due to the dense electrodes, allowing a very compact layout compared to conventional Rayleigh-mode resonators. In addition, a very weak Rayleigh wave is produced when propagating along the X-axis (ST-X, $K^2$=0.12%) in ST-Quartz. The acoustic velocity of the SH wave is 5100 m/s and the Rayleigh wave is 3400 m/s at the ST-90° X rotation. Thus, these modes are separated in frequency by a factor of 1.5× in ST-Quartz.

For 36YLT, acoustic propagation was parallel to the X-axis. The SH-LSAW velocity was 4077 m/s with a $K^2$=5.4%. A weak Rayleigh mode is also excited in 36YLT, which propagates at a 90° rotation to the X-axis (0°, −54°, 90°) with a velocity of 3152 m/s and $K^2$=0.035%. These acoustic modes are separated in frequency by a factor of 1.3× in 36YLT. The Rayleigh mode is very weak and the interdigital transducer (IDT) does not excite an acoustic wave, thus only a capacitor is formed by the IDT. The SH-LSAW resonators were designed to target a series resistance ~50Ω.

For both substrates, the R modes are very weak Rayleigh waves that appear out-of-band from the series resonance frequency. These modes serve as a reference (R) or inactive resonator, which are used to remove the shunt capacitance ($C_o$) for the Active Shunt Capacitance Cancelling Oscillator (ASCCO).

Example 6: SH-LSAW Resonator with an Inactive Resonator as the Reference Capacitor Acoustic resonators were fabricated to utilize the propagation of SH-LSAW waves. To minimize resistive losses when using the monitoring circuit, the series resistance of the resonator was designed to be about 50Ω. If this resistance is too low (e.g., less than about 10Ω), then the sensor appears as an electrical short to the monitoring circuit, which prevents start-up of the oscillator. If the series resistance is too high (e.g., more than about 300Ω), the loop gain of the detection will be too high and cause excessive noise. The IDTs were fabricated using 5000 Å tungsten (W) or gold (Au) with a 100 Å Ti adhesion film to provide high acoustic reflectivity per finger pair.

Figure 16A:
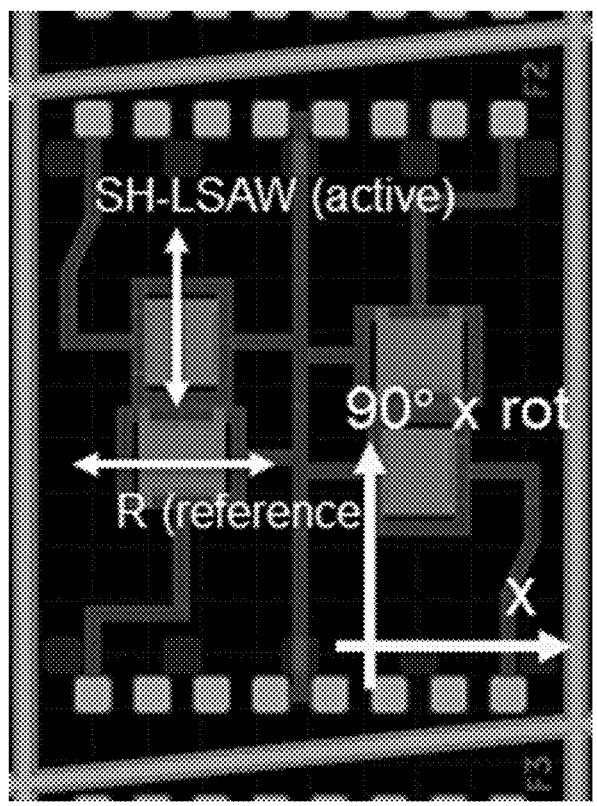
FIGS. 16A-16B show fabricated active and inactive sensors. Provided are (A) images of a fabricated SH-SAW sensor (active sensor) and a reference capacitor (inactive sensor). Propagation along the 90° rotation to the X-axis produces SH-LSAW (active sensor), where propagation along X-axis produces an inactive sensor for removal of the shunt capacitance. Also provided is (B) a micrograph of the fabricated sensor with 25 finger pairs. The tungsten thickness was 0.5 μm. A film of 1000 Å $SiO_2$ was deposited over the sensors. There are 10 Bragg reflector strips, and BL indicates bussing lines. Overall, the device measures 1.8 mm×2.4 mm.
Figure 16B:
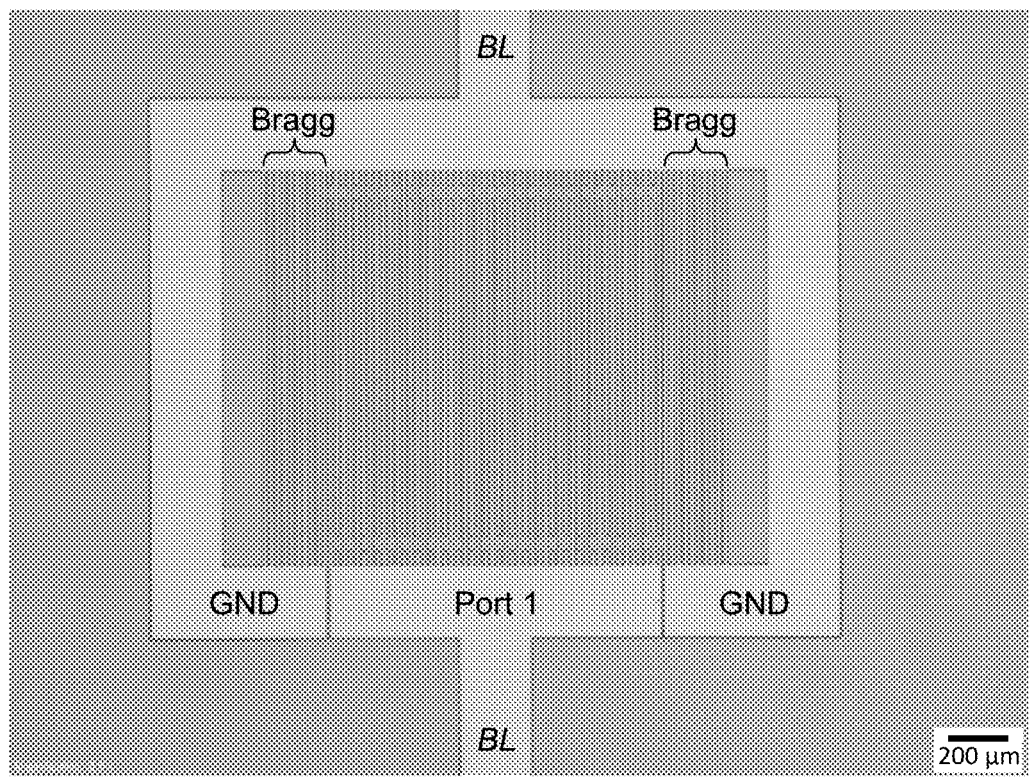

The wavelength of the ST-90° X devices was 46 μm, giving a resonator frequency of 100 MHz (FIG. 16B). The finger width was 11.5 μm with an aperture of 25λ, and 25 finger pairs. For the 100 MHz 36YLT resonators, the wavelength was 38 with a finger width of 9.5 an aperture of 25λ, and 25 finger pairs. The sensors had 500 Å to 1000 Å of $SiO_2$ deposited to passivate the IDTs.

In FIG. 16A, the layout is shown for the piezoelectrically active (working) resonator and the inactive resonator, which functions as a reference capacitor (R). The purpose of the inactive channel is to remove the effect of the non-zero shunt capacitance ($C_o$) in parallel with the motional resistance ($R_m$), motional inductance ($L_m$), and motional capacitance ($C_m$) of the sensor. It is desirable to measure the mechanical and electrical contributions of the acoustic resonators to avoid impedance distortion and phase shift problems associated with non-zero shunt capacitance. Thus, removing the shunt capacitance is highly desirable.

Shunt capacitance removal was achieved by using an inactive sensor that had no piezoelectric mode in the same frequency range as the active channel. The approach required creating the same shunt capacitance as the working sensor without piezoelectric activity. In general, for a SAW sensor, this is accomplished by fabricating an identical IDT that propagates an out-of-band or weakly coupled mode (e.g., a Rayleigh mode). For a bulk acoustic wave (BAW) sensor, this can be achieved by forming the equivalent shunt capacitance using an out-of-band acoustic mode (e.g., a Rayleigh mode) or fabricating a capacitor in proximity to the working sensors to obtain similar temperature dependence.

Example 7: Electrical Response of Resonators

Figure 17A:
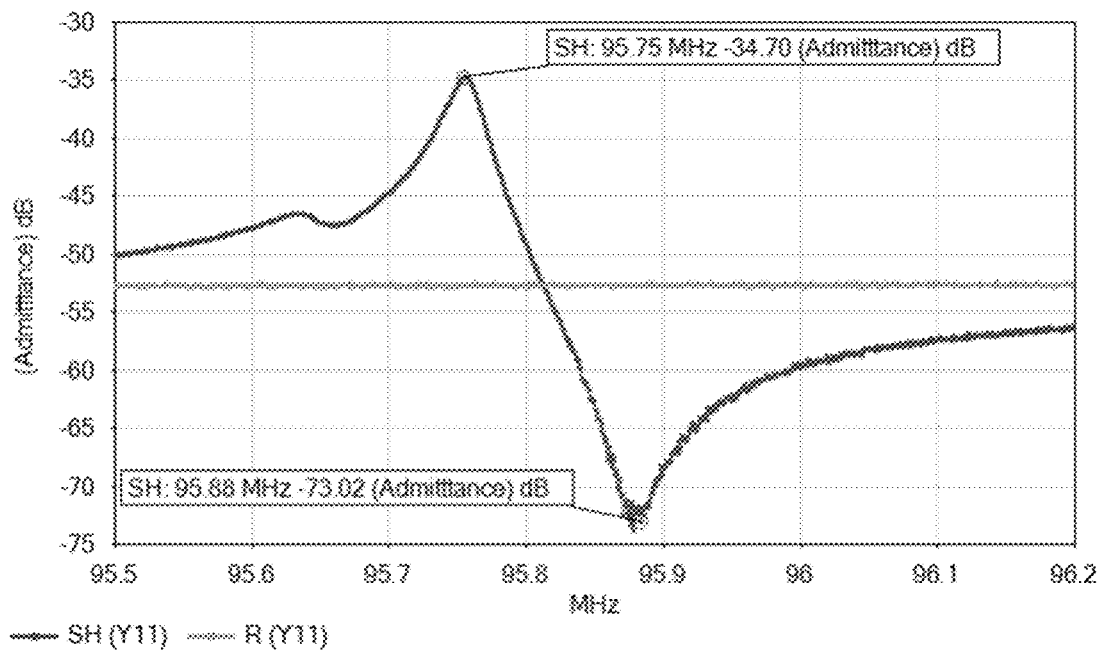
FIGS. 17A-17B show measured admittance of ST-90° X (magnitude and phase) of SH mode device (dark gray) and the reference (R) device (light gray) in air.
Figure 17B:
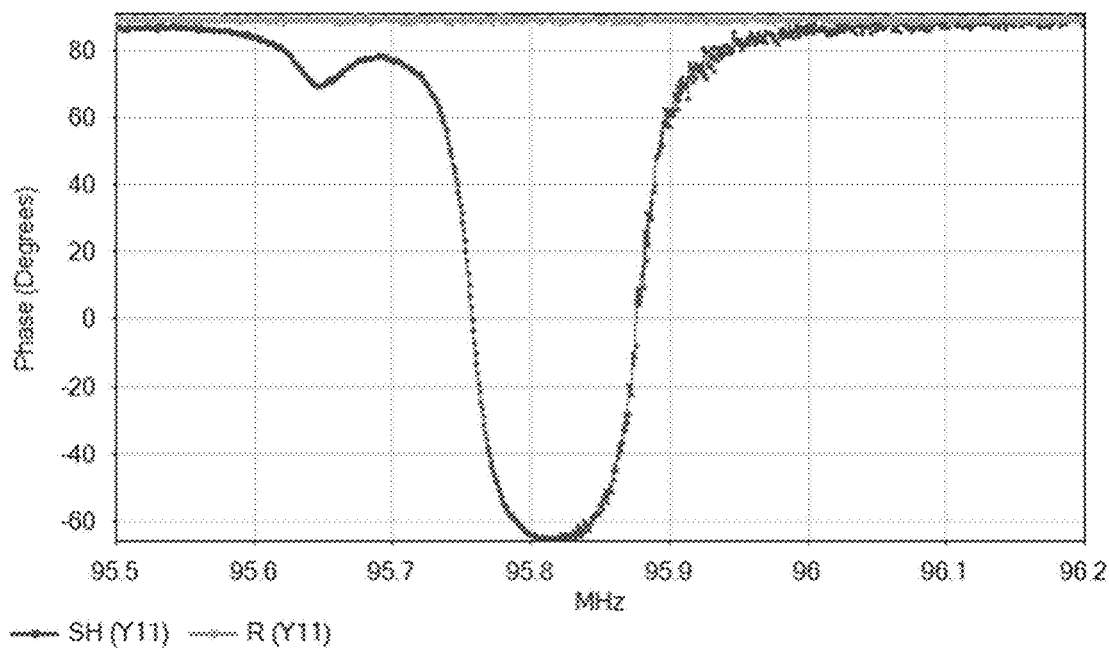

The electrical response of the ST-Quartz SH-LSAW sensors was measured on a probe station and is shown in FIGS. 17A-17B for air. The response confirms the presence of an SH-LSAW propagating mode with a frequency of 95 MHz. A Levenberg-Marquardt nonlinear fit was performed using the expression for the admittance of a 1-port resonator (see, e.g., Bandey H L et al., "Modeling the responses of thickness-shear mode resonators under various loading conditions," *Anal. Chem.* 1999; 71(11):2205-14):

$$SSE(f(C_o, R_m, F_s)) = \sum \text{residuals}(f(C_o, R_m, F_s))^2 = 0 \qquad (2)$$

$$Y_u = j\omega C_o + \cfrac{1}{R_m\left(\cfrac{\omega}{\omega_s}\right)^2 + j\omega\left[\cfrac{(N\pi)^2}{8K^2 C_o}\left(\cfrac{1}{\omega_s^2}\right) - \cfrac{1}{\omega^2}\right]} =$$

$$j\omega C_o + \cfrac{1}{R_m + j\omega L_m + \cfrac{1}{j\omega C_m}},$$

$$C_m = \frac{8K^2 C_o}{\pi^2}$$

-continued $$L_m = \frac{1}{\omega_s^2 C_m}$$

$$\omega_s = 2\pi F_s$$

where $\omega_s$ is the angular series resonance frequency, $F_s$ is the series resonance frequency, N is the harmonic mode, $K^2$ is the electromechanical coupling constant, $C_o$ is the static or shunt capacitance, $\omega$ is the angular frequency, $R_m$ is the dissipation in the system, $L_m$ is the inertial mass, and $C_m$ is the mechanical elasticity of the system. The fitted values were as follows: $F_s$=95.7 MHz, $K^2$=0.31%, $C_o$=3.6 pF, $C_m$=8.9 fF, $L_m$=309 µH, $R_m$=54Ω, and the quality factor Q=3412. This device has an excellent Q with a weak electromechanical coupling constant. A fit to the inactive reference capacitor ($Z=j\omega C_o$) gave $C_{o,ref}$=3.88 pF. This is very close to the shunt capacitance of the active resonator. These resonators were used to develop the ASCCO measurement hardware.

Figure 18A:
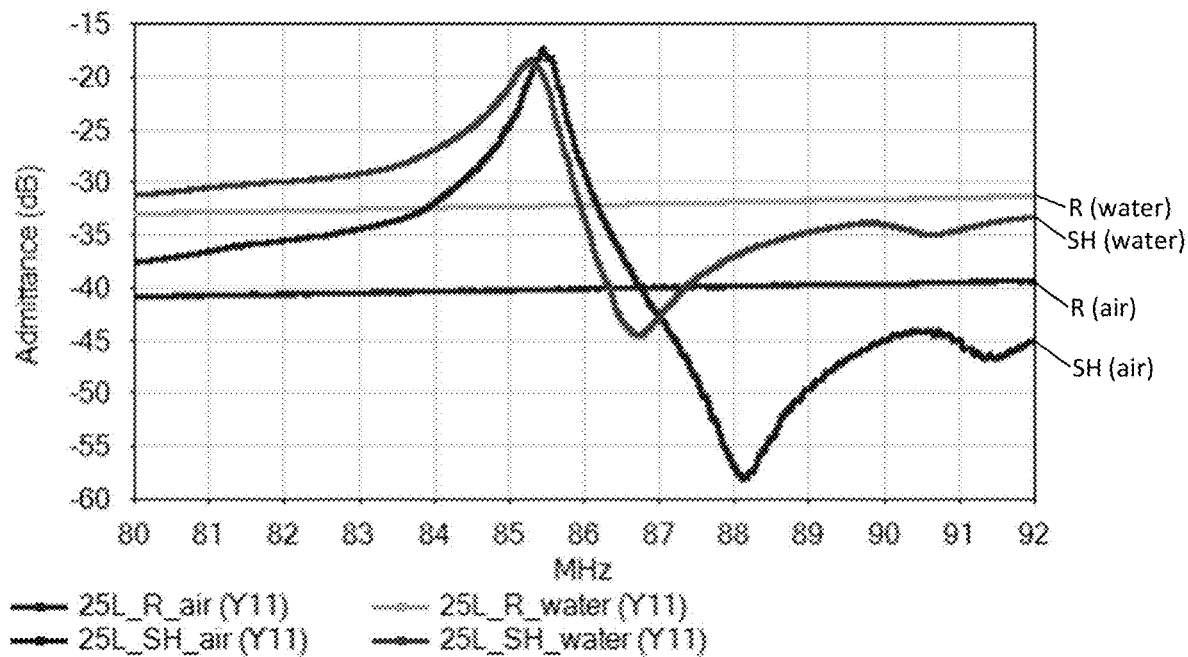
FIGS. 18A-18B show measured admittance of 36YLT (magnitude and phase) of SH mode device (labeled "SH") and the reference (R) device (labeled "R") in air and water. Devices were fabricated with Au IDTs.
Figure 18B:
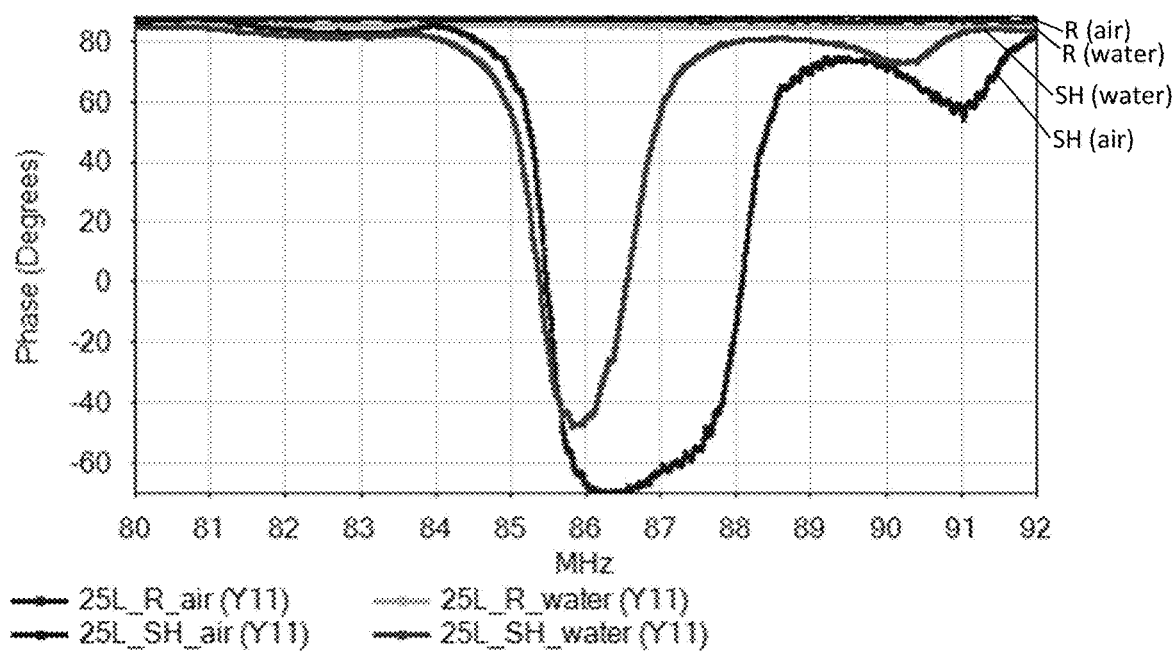

In FIGS. 18A-18B, the admittance and phase responses are shown for the 36YLT resonators. The resonance frequency was ~85 MHz, since the same design was used for this substrate and cut; however, this did not impact the measurement approach. The fitted values for air were as follows: $F_s$=85.5 MHz, $K^2$=7.2%, $C_o$=17.8 pF, $C_m$=1.0 pF, $L_m$=3.3 pH, $R_m$=7.2Ω, and Q=254. A fit to the inactive reference capacitor ($Z=j\omega C_o$) in air gave $C_{o,ref}$=18.4 pF. The fitted values for water were as follows: $F_s$=85.3 MHz, $K^2$=4.0%, $C_o$=43.2 pF, $C_m$=1.4 pF, $L_m$=2.5 µH, $R_m$=8Ω, and Q=165. The Q for this type of resonator is much lower than ST-90° X in air, but ST-90° X cannot operate when loaded with water due to its small $K^2$. A fit to the inactive reference capacitor ($Z=j\omega C_o$) in water gave $C_{o,ref}$=46.0 pF. These 36YLT sensors were not optimized and higher Qs are possible by reducing the number of excitation fingers in the IDT. Reducing the number of finger pairs would increase the Q while reducing the electromechanical coupling constant. Further optimization of the Bragg reflectors could improve the performance; however, the sensors were suitable for measurements in water.

Example 8: Biological Assays Employing Acoustic Resonators

Any useful biological assays can be conducted employing the systems herein. In one instance, the assay includes determining whether a certain compound (e.g., an antibiotic) can be used to treat a particular cellular colony (e.g., bacterial cell colony). For instance, if the bacteria is susceptible to treatment with the compound, then bacterial growth may be slower, as compared to a control. Such a change in growth rate can be determined by employing an acoustic resonator, which can detect whether there is a change in bacterial mass (e.g., increased or decreased colony growth) or release of cells (e.g., release of lysed cells) at or from the resonator surface.

Assays were performed with TOP10 and DH5a strains of E. coli, which were purchased from Invitrogen and New England Biolabs, respectively. E. coli MG1655 was purchased from ATCC. Plasmids pACYC-Lic+ (chloramphenicol resistance) and PG1AK (kanamycin and ampicillin resistance) were purchased from Addgene. All bacteria were cultured in LB medium at 37° C. with shaking.

For the SH-LSAW sensors to monitor physical properties of the bacteria being tested, the cells must be tightly coupled to the sensor surface. Although bacteria can adhere to $SiO_2$, silanization was tested to determine if it would improve the capture efficiency or strength of binding. In brief, borosilicate glass coverslips (Corning) were treated with 3-aminopropyl trimethoxysilane (APTMS). Coverslips were cleaned successively with acetone, methanol, 2-propanol, and water; dried with nitrogen; and then treated with UV-ozone for 15 minutes. Coverslips were then immersed in 1% APTMS in toluene for 15 minutes at room temperature, rinsed with toluene, then baked at 100° C. for 30 minutes.

E. coli cells grown to early stationary phase were labeled with 10 µM Syto®13 (nucleic acid probe) in Tris-buffered saline for 15 minutes, then resuspended at approximately $10^7$ cells/ml, and allowed to settle on coverslips for 15 minutes. Coverslips were then washed 3 times by dipping in Tris-buffered saline and mounted directly on slides for imaging (Olympus IX71 fluorescence microscope, 60× oil immersion objective). As expected, some bacteria adhered to the glass alone; however, silane treatment increased the number of bacteria still bound after washing coverslips with buffer, indicating stronger binding to the surface.

To perform an initial test of the sensors' ability to detect response of bacteria to antibiotics, common molecular cloning strains and one pseudo-wild-type strain of E. coli were selected. TOP10, DH5α, and MG1655 strains are sensitive to kanamycin, ampicillin, or chloramphenicol in the absence of a plasmid conferring resistance. Dose response growth curve analysis was performed to determine appropriate concentrations of antibiotic to use with each strain and plasmid combination.

To assess antibiotic dose response, each strain with each plasmid was cultured in 200 µL LB in 96-well microtiter plates for 24 hours in a Synergy H4 plate (BioTek Instruments, Inc., Winooski, Vt.) reader at 37° C. with 30 seconds shaking and collecting measurements of optical density at 600 nm (OD600) every 10-15 minutes. For experiments in which bacteria were applied to the resonator devices, cultures were harvested at late log to early stationary phase. Cells were centrifuged at 5000×g for 5 minutes then resuspended in either fresh LB medium or phosphate-buffered saline. For antibiotic treatment, 200 µg/ml kanamycin was added to cells in the sensor devices. Positive controls for cell death were conducted by adding sodium hydroxide to cells in the devices at a final concentration of 1M.

To ensure antibiotic effects were as pronounced and rapid as possible, the highest concentration (200 µg/ml) kanamycin was used in the initial sensor test experiments described below. Since kanamycin acts by inhibiting protein synthesis rather than directly lysing bacterial cells, the exposure duration to yield a detectable change with E. coli was uncertain. To determine the effect of rapid complete lysis of bacteria on the sensor surface, sodium hydroxide was added at final concentration 1M. Complete lysis under these conditions was verified by phase contrast microscopy.

Figure 19A:
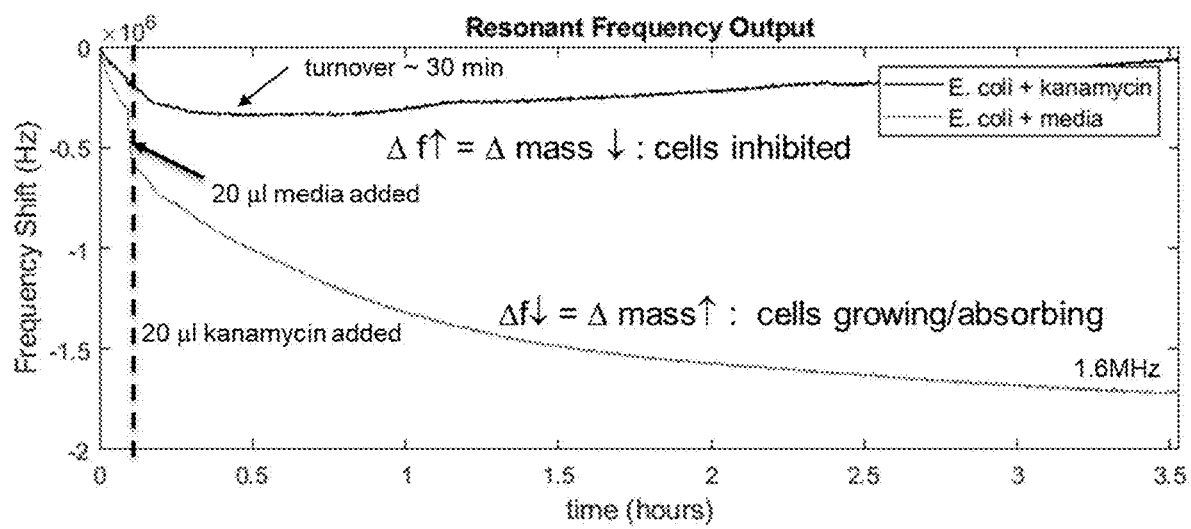
FIGS. 19A-19B show results of assays conducted with an acoustic wave sensor system including an active shunt capacitance cancelling oscillator circuit. Provided are measured frequency shifts (A,B) for *E. coli* cells in the presence of an antibiotic (kanamycin, black), as compared to control (exposure to media, gray).
Figure 19B:
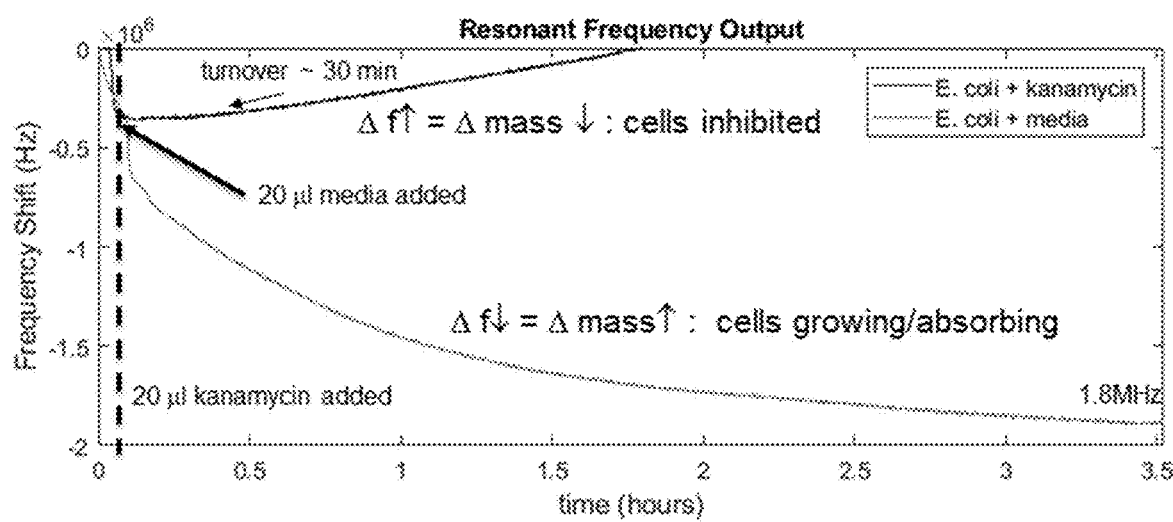

The sensitivity of E. coli TOP10 to kanamycin was measured using the 36YLT SH-LSAW sensors which have a resonate frequency of ~85 MHz. In the assay, a sample of E. coli TOP10 was prepared at undiluted concentrations consisting of approximately $10^8$ cfu/ml. Kanamycin was prepared at 15× (375 µg/ml) in Tris-buffered saline. FIG. 19A shows the time-response of adding kanamycin to E. coli in the fluidic cell. At t=0, the fluidic cell was filled with E. coli and media. In the absence of kanamycin, the E. coli is expected to steadily absorb and grow on the surface of the resonators, causing the resonant frequency to decrease. In FIG. 19B, the results indicate a similar trend, except the resonant frequency steadily increases beyond the starting frequency shift of '0', indicating that the top surface of the sensor is lifting off into solution. However, the results indicate that *E. coli* ($10^8$ cells/ml) in the presence of kanamycin are not able to adhere, where the turnover time is 30 min to 60 min. Pre-plating the bacteria to the surface of the acoustic resonators would reduce the amount of bacteria required in the samples.

Overall, we demonstrate that acoustic resonators (sensors) can be used to detect antibiotic resistance of bacteria (e.g., *E. coli*) on a shorter time-scale than other growth based methods. In addition, a new monitoring method was created that enables removal of the shunt capacitance from the resonators. This method is called active shunt capacitance cancelling oscillator (ASCCO), which tracks the true acoustic series resonance and damping of the resonator unlike other methods. Since the method avoids impedance distortion and phase shift problems associated with non-zero shunt capacitance, it is valuable for sensor applications. SH-LSAW sensors using ST-Quartz and 36YLT substrates were developed for air and liquid based measurements. These sensors had a resonant frequency of 85 MHz to 100 MHz. The use of dense metal electrodes supported the excitation of SH-LSAW acoustic waves, creating very compact sensors. The ST-90° X resonators were used to develop the ASCCO circuit. However, since the electromechanical coupling of ST-90° X is small, liquid damping was excessive and prevented operation in water. In contrast, the electromechanical coupling of 36YLT is 46× larger and thus suitable for liquid phase sensing. Measurements showed that the adsorption of *E. coli* to the sensors was inhibited by the presence of kanamycin when used in a growth/absorbing based assay.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. An oscillator circuit comprising:
   an active resonator comprising a first piezoelectric substrate;
   an inactive resonator comprising a second piezoelectric substrate, wherein the inactive resonator propagates an acoustic mode that is not acoustically active;
   an amplifier comprising an amplifier input and an amplifier output;
   a tank circuit connected between ground and the amplifier input, wherein the tank circuit comprises an inductor, a capacitor, and a resistor;
   a transistor connected between the active resonator and the amplifier output; and
   a current mirror connected between the transistor and the amplifier input, wherein the current mirror is configured to provide a current component that is based upon a capacitance of the inactive resonator, wherein the current component is configured to cancel a shunt capacitance associated with the active resonator.

2. The oscillator circuit of claim 1, further comprising:
   a second transistor connected between the inactive resonator and the amplifier output; and
   a second current mirror connected between the first transistor and the second transistor.

3. The oscillator circuit of claim 1, wherein the amplifier comprises a multi-gain stage limiting amplifier.

4. The oscillator circuit of claim 1, wherein the first piezoelectric substrate and the second piezoelectric substrate are formed of a same material.

5. The oscillator circuit of claim 1, further comprising:
   a first current source that is placed electrically in parallel with the active resonator; and
   a second current source that is placed electrically in parallel with the inactive resonator.

6. The oscillator circuit of claim 5, further comprising:
   a second transistor connected between the inactive resonator and the amplifier output;
   a second current mirror connected between the first transistor and the second transistor; and
   a third current source connected between the current mirror and the second current mirror.

7. The oscillator circuit of claim 1, wherein the amplifier is included in a feedback loop about the transistor.

8. The oscillator circuit of claim 1, further comprising a current source that is coupled to a non-inverting output of the transistor.

9. An oscillator circuit comprising:
   an active resonator, wherein the active resonator has a shunt capacitance associated therewith; and
   an inactive resonator that is electrically coupled to the active resonator, wherein the inactive resonator is configured to facilitate generation of an output current that cancels the shunt capacitance of the active resonator, and further wherein the inactive resonator propagates an acoustic mode that is not acoustically active in connection with cancelling the shunt capacitance of the active resonator.

10. The oscillator circuit of claim 9, wherein the active resonator circuit comprises a first piezoelectric substrate and the inactive resonator comprises a second piezoelectric substrate, and further wherein the first piezoelectric substrate and the second piezoelectric substrate are formed of a same material.

11. The oscillator circuit of claim 9, wherein the active resonator circuit comprises a first piezoelectric substrate and the inactive resonator comprises a second piezoelectric substrate, and further wherein the first piezoelectric substrate and the second piezoelectric substrate are formed of a different material.

12. The oscillator circuit of claim 9, further comprising:
   an amplifier that has an amplifier input and an amplifier output; and
   a transistor that is coupled between the amplifier output and the active resonator.

13. The oscillator circuit of claim 12, wherein the amplifier comprises a multi-gain stage limiting amplifier.

14. The oscillator circuit of claim 12, wherein the amplifier comprises a single gain stage limiting amplifier.

15. The oscillator circuit of claim 12, further comprising a current mirror that is connected between the transistor and the amplifier input, wherein the current mirror is configured to provide a current component that is configured to cancel the shunt capacitance of the active resonator.

16. The oscillator circuit of claim 15, further comprising:
a second transistor connected between the inactive resonator and the amplifier output; and
a second current mirror connected between the transistor and the second transistor.

17. The oscillator circuit of claim 12, further comprising a tank circuit connected between ground and the amplifier input, wherein the tank circuit comprises an inductor, a capacitor, and a resistor.

18. The oscillator circuit of claim 9, further comprising:
a first current source that is placed electrically in parallel with the active resonator; and
a second current source that is placed electrically in parallel with the inactive resonator.

19. An oscillator circuit comprising:
an active resonator comprising a first piezoelectric substrate;
an inactive resonator comprising a second piezoelectric substrate;
an amplifier comprising an amplifier input and an amplifier output;
a tank circuit connected between ground and the amplifier input, wherein the tank circuit comprises an inductor, a capacitor, and a resistor;
a first transistor having an input connected to the amplifier output and a non-inverting output connected to the active resonator;
a first current mirror connected between an inverting output of the first transistor and the amplifier input;
a second transistor having an input connected to the amplifier output and a non-inverting output connected to the inactive resonator; and
a second current mirror connected between an inverting output of the second transistor and the inverting output of the first transistor, wherein the first current mirror and the second current mirror are configured to provide a current component controlled by a capacitance of the inactive resonator, thereby effectively cancelling out a shunt capacitance associated with the active resonator.

\* \* \* \* \*